(12) United States Patent
Makiyama et al.

(10) Patent No.: US 11,646,366 B2
(45) Date of Patent: May 9, 2023

(54) SEMICONDUCTOR DEVICE

(71) Applicant: FUJITSU LIMITED, Kawasaki (JP)

(72) Inventors: Kozo Makiyama, Kawasaki (JP); Shirou Ozaki, Yamato (JP); Atsushi Yamada, Hiratsuka (JP); Junji Kotani, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 64 days.

(21) Appl. No.: 17/129,552

(22) Filed: Dec. 21, 2020

(65) Prior Publication Data

US 2021/0234031 A1 Jul. 29, 2021

(30) Foreign Application Priority Data

Jan. 24, 2020 (JP) .............................. JP2020-010323

(51) Int. Cl.
*H01L 29/78* (2006.01)
*H01L 29/778* (2006.01)

(52) U.S. Cl.
CPC ...... *H01L 29/7787* (2013.01); *H01L 29/7781* (2013.01)

(58) Field of Classification Search
CPC ... H01L 29/122–127; H01L 29/15–158; H01L 29/42316; H01L 29/6656; H01L 29/66431; H01L 29/66462; H01L 29/6653; H01L 29/66719; H01L 29/778–7789; H01L 29/7816; H01L 29/808; H01L 29/812; H01L 2924/13064; H01L 29/7787; H01L 29/7781; H01L 29/0657; H01L 29/41766; H01L 29/408; H01L 29/2003; H01L 29/7786

USPC ............................ 257/194, 192, 195, 76, 77
See application file for complete search history.

(56) References Cited

U.S. PATENT DOCUMENTS

| 6,294,801 B1* | 9/2001 | Inokuchi | H01L 29/42316 257/E29.127 |
| 2001/0015446 A1 | 8/2001 | Inoue et al. | |
| 2002/0005528 A1 | 1/2002 | Nagahara | |
| 2010/0102359 A1* | 4/2010 | Khan | H01L 21/30621 257/E21.403 |
| 2011/0169014 A1* | 7/2011 | Yamaki | H01L 29/66462 257/77 |
| 2012/0049243 A1* | 3/2012 | Wu | H01L 29/7787 257/E29.246 |
| 2017/0194474 A1* | 7/2017 | Shirota | H01L 29/205 |

(Continued)

FOREIGN PATENT DOCUMENTS

| JP | 2001-230407 A | 8/2001 |
| JP | 2002-100642 A | 4/2002 |

(Continued)

*Primary Examiner* — Natalia A Gondarenko
(74) *Attorney, Agent, or Firm* — ArentFox Schiff LLP

(57) ABSTRACT

A disclosed semiconductor device includes an electron transit layer; an electron supply layer disposed above the electron transit layer; a source electrode, a drain electrode, and a gate electrode, the source electrode, the drain electrode, and the gate electrode being disposed on the electron supply layer; a first capping layer disposed on the electron supply layer between the gate electrode and the drain electrode; and a negative charge generation layer disposed on the first capping layer, the negative charge generation layer being configured to generate a negative charge.

13 Claims, 32 Drawing Sheets

(56) References Cited

U.S. PATENT DOCUMENTS

| | | | |
|---|---|---|---|
| 2017/0345919 A1 | 11/2017 | Oyama et al. | |
| 2018/0019311 A1* | 1/2018 | Kamada | H03F 1/3247 |
| 2018/0019333 A1 | 1/2018 | Kamada et al. | |
| 2020/0273974 A1* | 8/2020 | Guidry | H01L 29/7781 |

FOREIGN PATENT DOCUMENTS

| | | | |
|---|---|---|---|
| JP | 2013-225621 A | 10/2013 | |
| JP | 2013-229486 A | 11/2013 | |
| JP | 2014-229767 A | 12/2014 | |
| JP | 2014-241379 A | 12/2014 | |
| JP | 2016-127089 A | 7/2016 | |
| JP | 2018-010936 A | 1/2018 | |

* cited by examiner

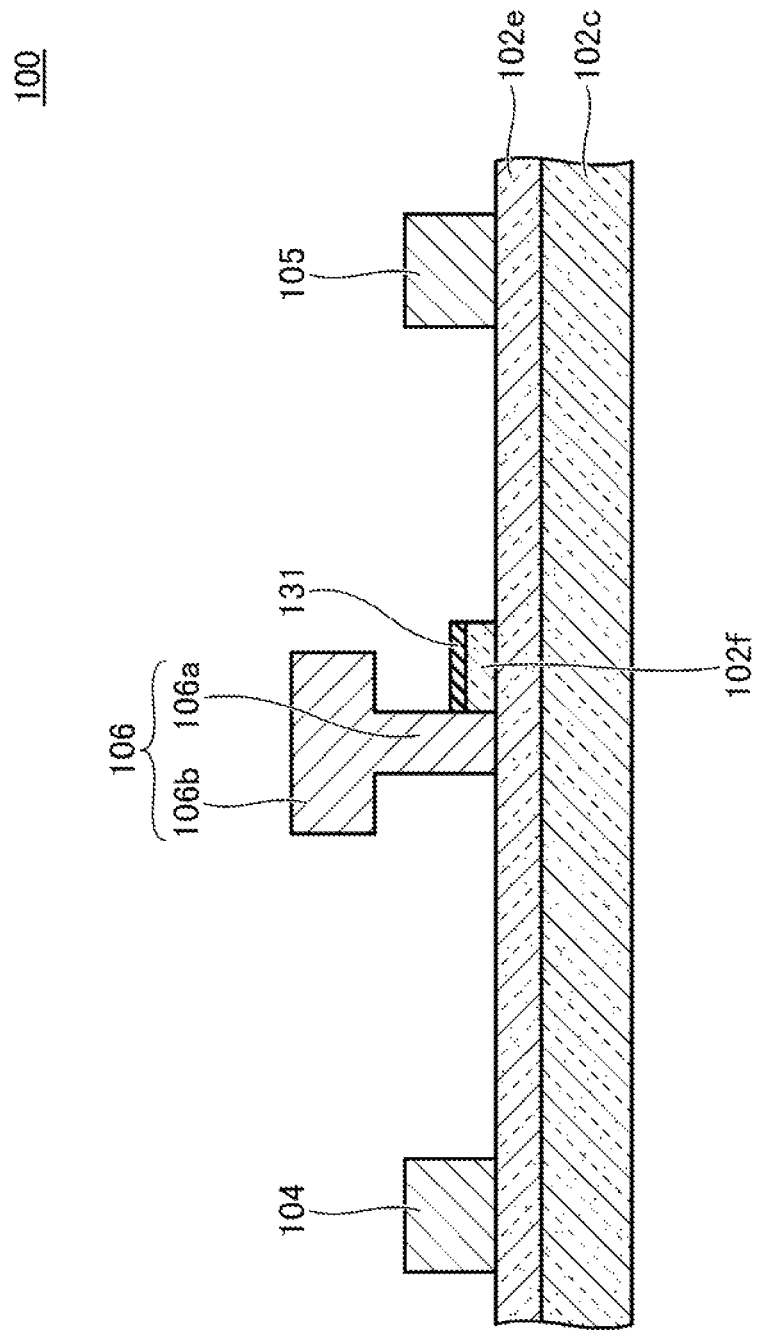

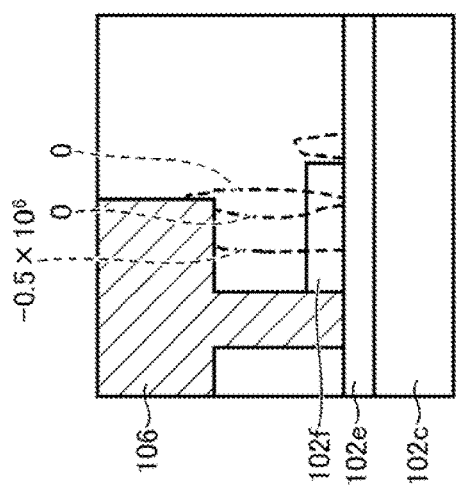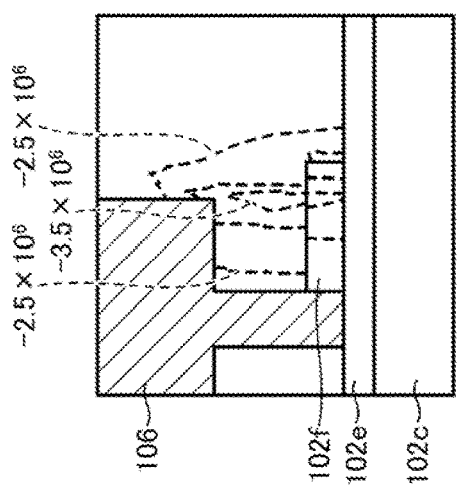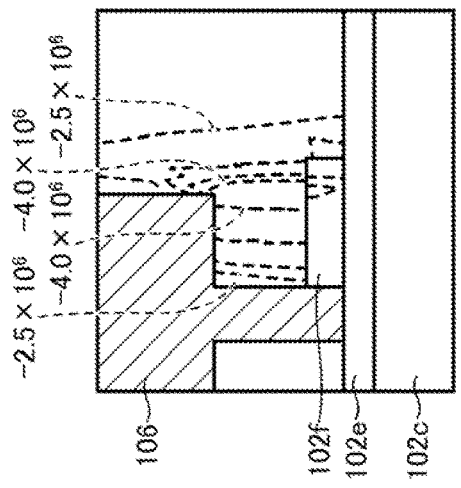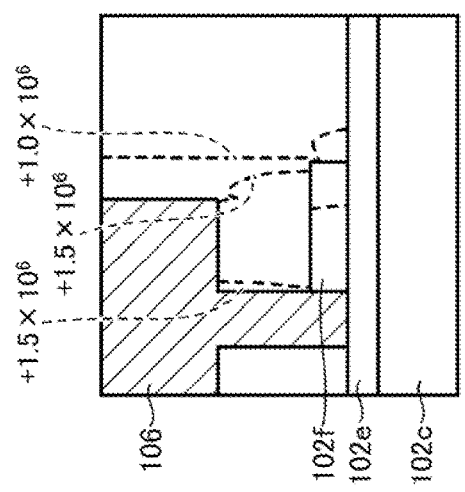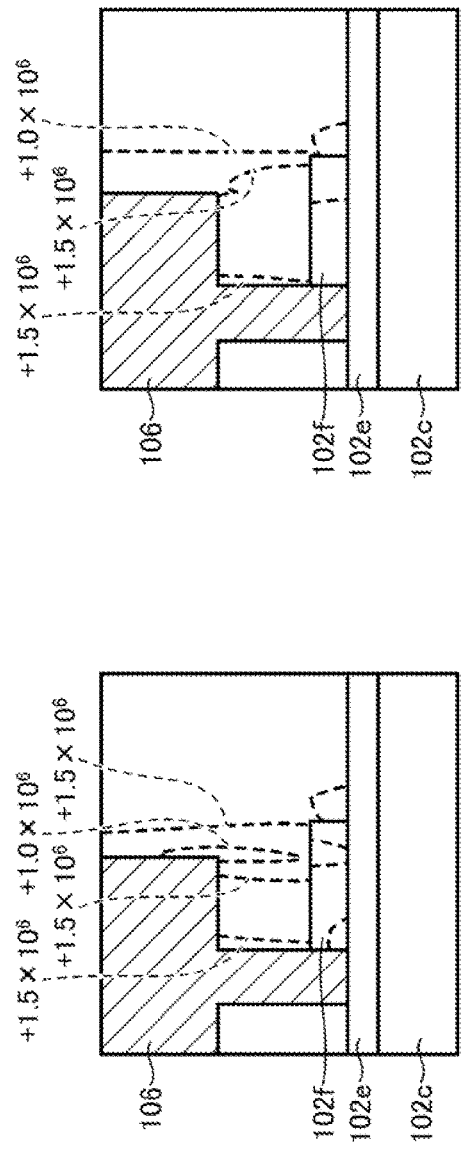

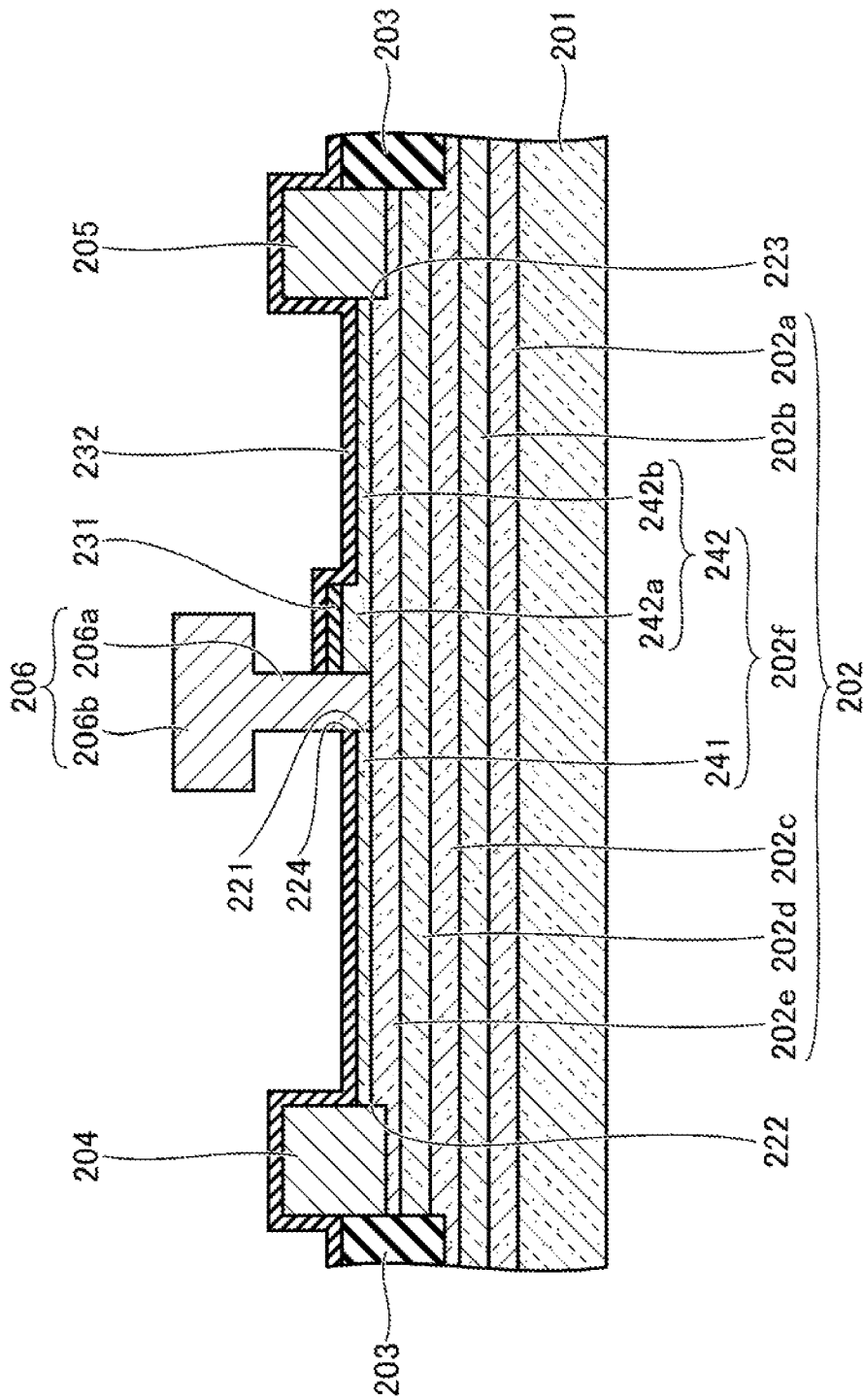

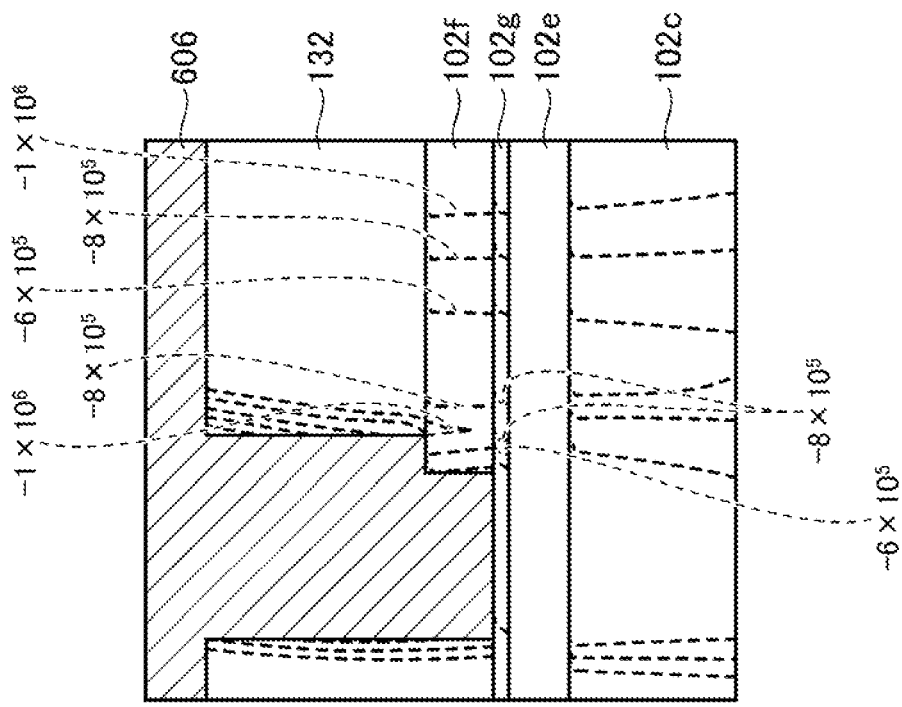
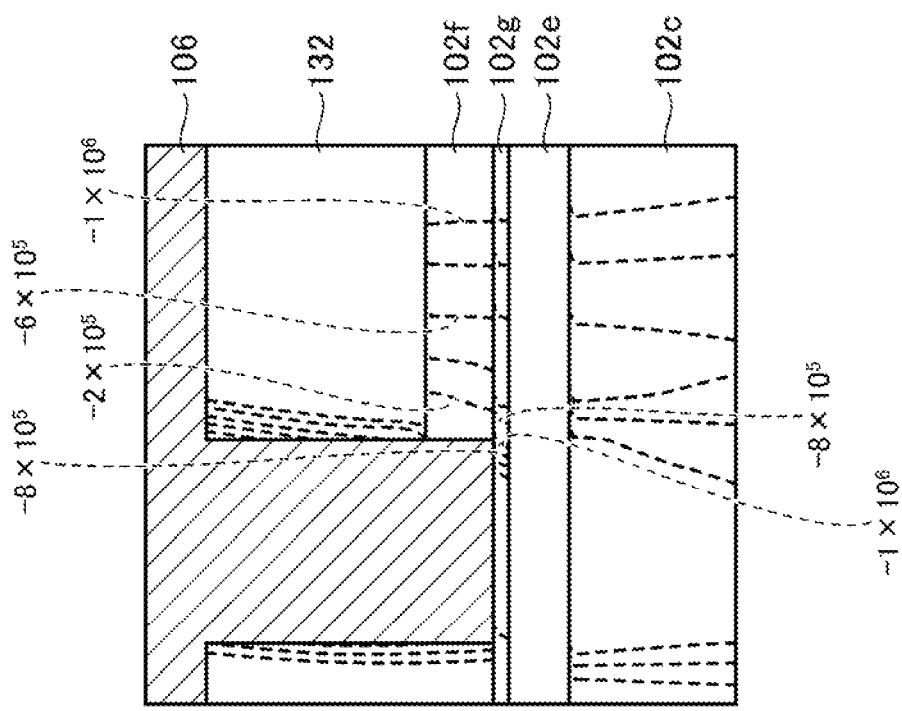

SEMICONDUCTOR DEVICE

CROSS-REFERENCE TO RELATED APPLICATIONS

The present application is based upon and claims the benefit of priority from the prior Japanese Patent Application No. 2020-010323 filed on Jan. 24, 2020 with the Japanese Patent Office, the entire contents of which are incorporated herein by reference.

FIELD

The present disclosure discussed herein relates to a semiconductor device.

BACKGROUND

Nitride semiconductors are characterized by high saturated electron velocities, wide band gaps, and the like. Various studies have been conducted on the application of nitride semiconductors to high-voltage and high-power semiconductor devices utilizing such properties. Examples of semiconductor devices utilizing nitride semiconductors include field effect transistors such as high-electron-mobility transistors (HEMTs). In GaN-based HEMTs, GaN is used for an electron transit layer (a channel layer), and AlN or AlGaN is used for an electron supply layer (a barrier layer).

In related art HEMTs, a gate electrode may be disposed closer to a source electrode than to a drain electrode. The shorter the distance between the gate electrode and the source electrode, the lower the source resistance and the greater the power density. The longer the distance between the gate electrode and the drain electrode, the higher the drain resistance, and the higher the drain breakdown voltage.

RELATED-ART DOCUMENTS

Patent Documents

[Patent Document 1] Japanese Laid-Open Patent Publication No. 2001-230407
[Patent Document 2] Japanese Laid-Open Patent Publication No. 2013-229486
[Patent Document 3] Japanese Laid-Open Patent Publication No. 2014-229767
[Patent Document 4] Japanese Laid-Open Patent Publication No. 2016-127089
[Patent Document 5] Japanese Laid-Open Patent Publication No. 2018-010936
[Patent Document 6] Japanese Laid-Open Patent Publication No. 2013-225621
[Patent Document 7] Japanese Laid-Open Patent Publication No. 2014-241379
[Patent Document 8] Japanese Laid-Open Patent Publication No. 2002-100642

SUMMARY

According to one aspect of the present disclosure, a semiconductor device includes an electron transit layer; an electron supply layer disposed above the electron transit layer; a source electrode, a drain electrode, and a gate electrode, the source electrode, the drain electrode, and the gate electrode being disposed on the electron supply layer; a first capping layer disposed on the electron supply layer between the gate electrode and the drain electrode; and a negative charge generation layer disposed on the first capping layer, the negative charge generation layer being configured to generate a negative charge.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 3 is a cross-sectional view illustrating a semiconductor device according to a first embodiment;

FIGS. 4A to 4E are diagrams (Part 1) each illustrating the results of simulation according to the first embodiment;

FIG. 13 is a cross-sectional view illustrating a semiconductor device according to a third embodiment;

FIGS. 19A and 19B are graphs (Part 1) illustrating results of simulation according to the sixth embodiment;

DESCRIPTION OF EMBODIMENTS

Figure 1:
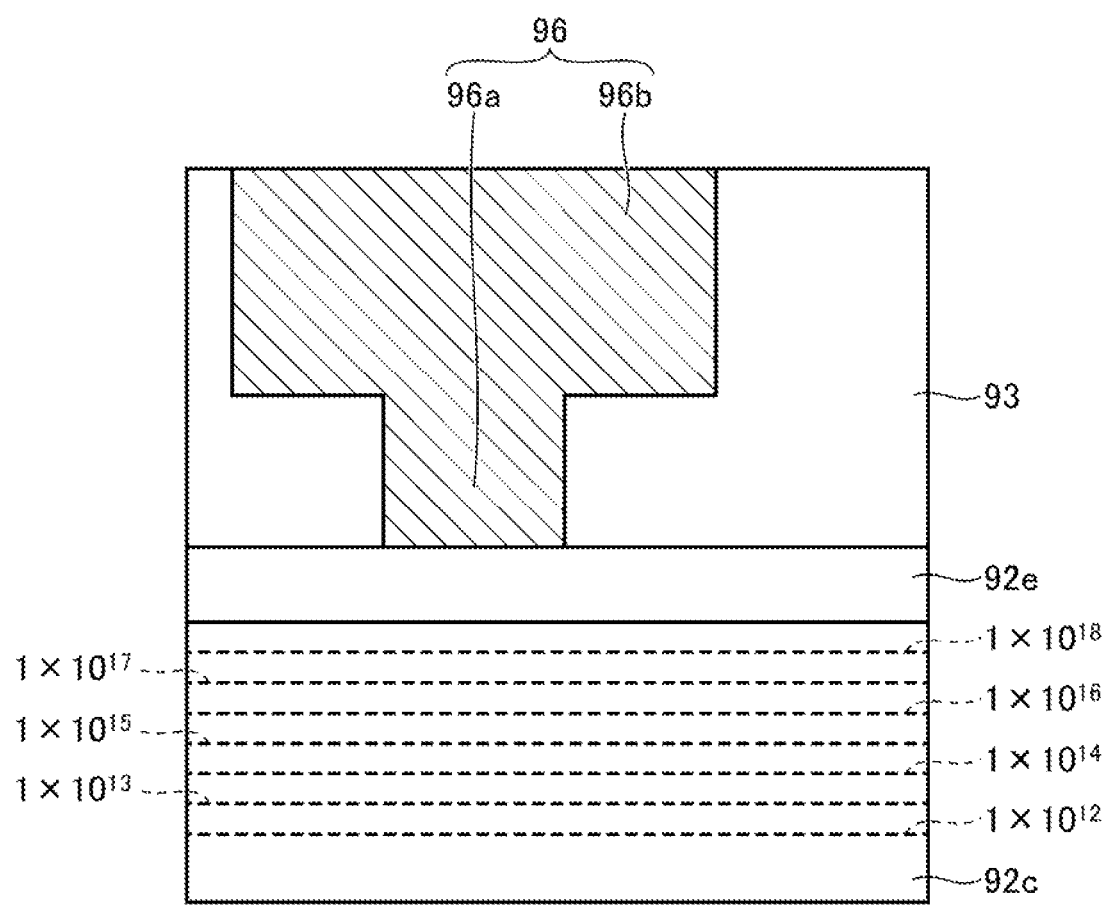
FIG. 1 is a diagram illustrating a distribution of electron concentration in a semiconductor device according to a reference example.

In related-art HEMT structures, it appears difficult to improve a drain breakdown voltage.

It is an object of the present disclosure to provide a semiconductor device capable of improving a drain breakdown voltage.

Hereinafter, embodiments of the present disclosure will be described in detail with reference to the accompanying drawings. In the present specification and the drawings, duplicated description of components having substantially the same functional configurations may be omitted by adding the same reference numerals.

Reference Example

Figure 2:
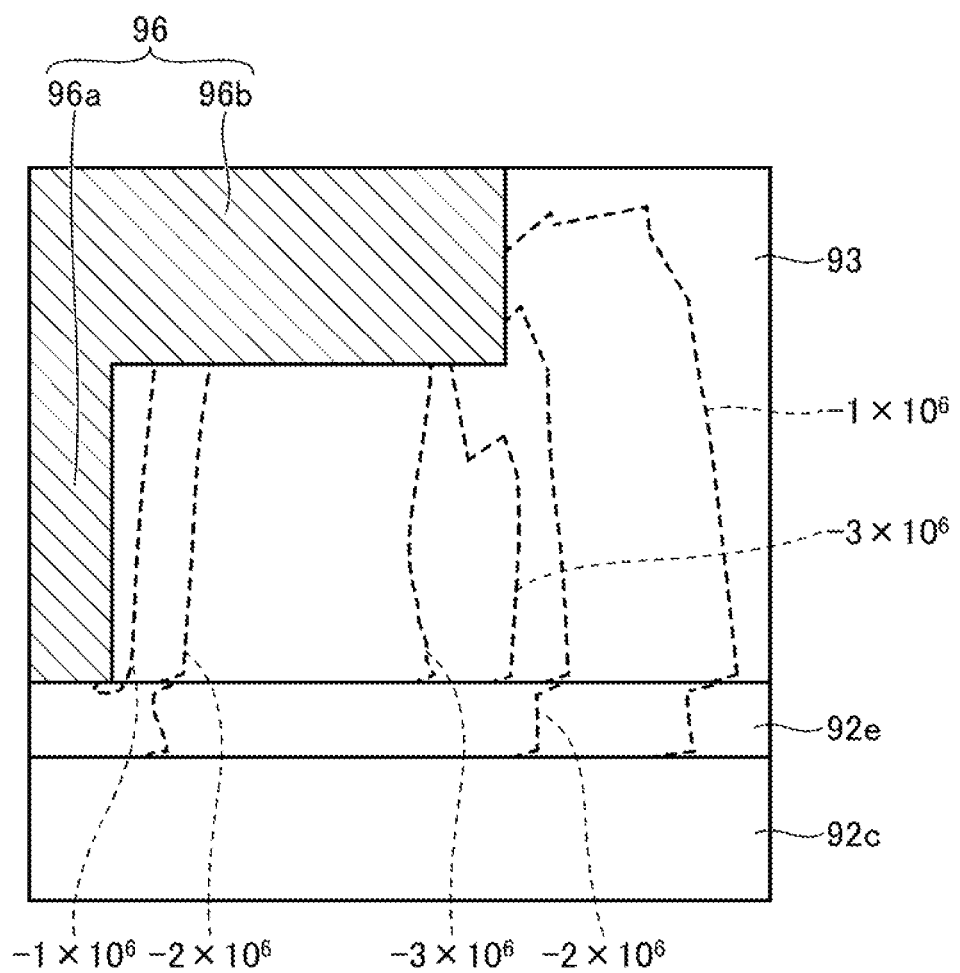
FIG. 2 as a diagram illustrating a distribution of the electric field intensity in the semiconductor device according to the reference example.

Initially, diligent studies have been conducted using a reference example in order to improve a drain breakdown voltage in the related art HEMTs. FIG. 1 is a diagram illustrating a distribution of electron concentration in a semiconductor device according to a reference example. FIG. 2 is a diagram illustrating a distribution of electric field intensity in the semiconductor device according to the reference example. The unit of electron concentration in FIG. 1 is $cm^{-3}$. The unit of field intensity in FIG. 2 is V/cm. Signs of the electric field intensities in FIG. 2 indicate directions of the electric field. FIG. 2 illustrates the field intensities when a source-drain voltage is 100 V and a source-gate voltage is −8 V.

In the semiconductor device according to the reference example, an AlGaN electron supply layer 92e is disposed on a GaN electron transit layer 92c, and a gate electrode 96 is disposed on the electron supply layer 92e. The gate electrode 96 has a base portion 96a, and an umbrella portion 96b above the base portion 96a, such that a cross-sectional shape of the gate electrode 96 is substantially T-shaped. A $Si_3N_4$ insulating layer 93 is disposed around the gate electrode 96. That is, the insulating layer 93 is a stoichiometric silicon nitride layer. The insulating layer 93 is also present between the umbrella portion 96b and the electron supply layer 92e.

According to the reference example having such a configuration, electrons at thermal equilibrium are distributed at a uniform concentration in the vicinity of a heterointerface between the electron transit layer 92c and the electron supply layer 92e within a range from a source electrode to a drain electrode, excluding a depletion layer modulation region immediately beneath the gate electrode 96, as illustrated in FIG. 1. That is, there is a two-dimensional electron gas (2DEG) with substantially uniform concentration.

The high concentration of 2DEG is present in the vicinity of the heterointerface. This high concentration of 2DEG may induce high concentration of electrons in the vicinity of the gate electrode 96, and in turn propagate high potentials of the drain electrode, as illustrated in FIG. 2. As a result, tunneling current of the gate electrode 96 at the drain end is high. Even when the distance between the gate electrode and the drain electrode is increased, it is still difficult to improve a drain breakdown voltage. Accordingly, it is considered that reducing the electron concentration in the vicinity of the gate electrode 96 may reduce the electric field concentration, and improve a drain breakdown voltage.

Based on these new findings, the following embodiments have been proposed in order to improve a drain breakdown voltage.

First Embodiment

A first embodiment will be described. The first embodiment relates to a semiconductor device including a high-electron-mobility transistor (HEMT). FIG. 3 is a cross-sectional view illustrating a semiconductor device according to the first embodiment.

The semiconductor device 100 according to a first embodiment includes an electron transit layer (a channel layer) 102c, an electron supply layer (a barrier layer) 102e, a capping layer 102f, a negative charge generation layer 131, a source electrode 104, a drain electrode 105, and a gate electrode 106, as illustrated in FIG. 3. In the semiconductor device 100 according to the first embodiment, the electron transit layer 102c and the electron supply layer 102e are stacked on each other.

The source electrode 104, the drain electrode 105, and the gate electrode 106 are disposed on electron supply layer 102e. The gate electrode 106 is disposed between the source electrode 104 and the drain electrode 105. For example, the gate electrode 106 has a base portion 106a and an umbrella portion 106b above the base portion 106a, The capping layer 102f is disposed on the electron supply layer 102e at least between the gate electrode 106 and the drain electrode 105, The negative charge generation layer 131 configured to generate a negative charge is disposed on the capping layer 102f.

The negative charge generation layer 131 contains more electrons than holes such that the negative charge generation layer 131 is negatively charged. For example, the negative charge generation layer 131 has a composition having an excess of elements that tend to become anions or elements that have high electron affinity relative to its stoichiometric composition. For example, the negative charge generation layer 131 may contain a composition having an excess of anionic elements or elements with high electronegativity relative to its stoichiometric composition.

For example, the negative charge generation layer 131 is a silicon nitride layer with excess nitrogen, or an aluminum oxide layer with excess oxygen. When the negative charge generation layer 131 is a silicon nitride layer with excess nitrogen, and a composition of the negative charge generation layer 131 is represented by $Si_XN_Y$, the value of X/Y is less than ¾. When the negative charge generation layer 131 is an aluminum oxide layer with excess oxygen, and a composition of the negative charge generation layer 131 is represented by $Al_XO_Y$, the value of X/Y is less than ⅔.

For example, the negative charge generation layer 131 may be an aluminum fluoride layer or a silicon fluoride layer with excess fluorine. When the negative charge generation layer 131 is an aluminum fluoride layer with excess fluorine, and a composition of the negative charge generation layer 131 is represented by $Al_XF_Y$, the value of X/Y is less than ⅓. When the negative charge generation layer 131 is a silicon fluoride layer with excess fluorine, and a composition of the negative charge generation layer 131 is represented by $Si_XF_Y$, the value of X/Y is less than ¼.

The negative charge generation layer 131 may be formed by three or more elements. For example, the negative charge generation layer 131 may be an AlON layer, SiON layer, AlOF layer, or SiOF layer.

When the negative charge generation layer 131 is an AlON layer, Al is an element that becomes a cation, and O and N are elements that become an anion, where the valence a1 of the aluminum ion is 3, the valence b1 of the oxide ion is 2, and the valence b2 of the nitride ion is 3. When a composition of the negative charge generation layer 131 is represented by $Al_{X1}O_{Y1}N_{Y2}$, $a1 \times X1 - (b1 \times Y1 + b2 \times Y2) = 3 \times X1 - (2 \times Y1 + 3 \times Y2)$, which is negative.

When the negative charge generation layer 131 is a SiON layer, Si is an element that becomes a cation, and O and N are elements that become an anion, where the valence of the silicon ion a1 is 4, the valence b1 of the oxide ion is 2, and the valence b2 of the nitride ion is 3. When a composition of the negative charge generation layer 131 is represented by $Si_{X1}O_{Y1}N_{Y2}$, $a1 \times X1 - (b1 \times Y1 + b2 \times Y2) = 4 \times X1 - (2 \times Y1 + 3 \times Y2)$, which is negative.

When the negative charge generation layer 131 is an AlOF layer, Al is an element that becomes a cation, and O and F are elements that become an anion, where the valence a1 of the aluminum ion is 3, the valence b1 of the oxide ion is 2, and the valence b2 of the fluoride ion is 1. When a composition of the negative charge generation layer 131 is represented by $Al_{X1}O_{Y1}F_{Y2}$, $a1 \times X1 - (b1 \times Y1 + b2 \times Y2) = 3 \times X1 - (2 \times Y1 + 1 \times Y2)$, which is negative.

When the negative charge generation layer 131 is a SiOF layer, Si is an element that becomes a cation, and O and F are elements that become an anion, wherein the valence a1 of the silicon ion is 4, the valence b1 of the oxide ion is 2, and the valence b2 of the fluoride ion is 1. When a composition of the negative charge generation layer 131 is represented by $Si_{X1}O_YF_{Y2}$, $a1 \times X1 - (b1 \times Y1 + b2 \times Y2) = 4 \times X1 - (2 \times Y1 + 1 \times Y2)$, which is negative.

To generalize the above examples, the negative charge generation layer 131 may include elements that become m types (m is a natural number) of cations, and elements that become n types (n is a natural number) of anions. In this configuration, when a composition of the negative charge generation layer 131 is represented by $Am_{Xm} \ldots Bn_{Yn} \ldots$, a cationic valence of the element Am is represented by am, and an anionic valence of the element Bn is represented by bn, $\Sigma am \times Xm - \Sigma bn \times Yn$ is negative.

Figure 5:
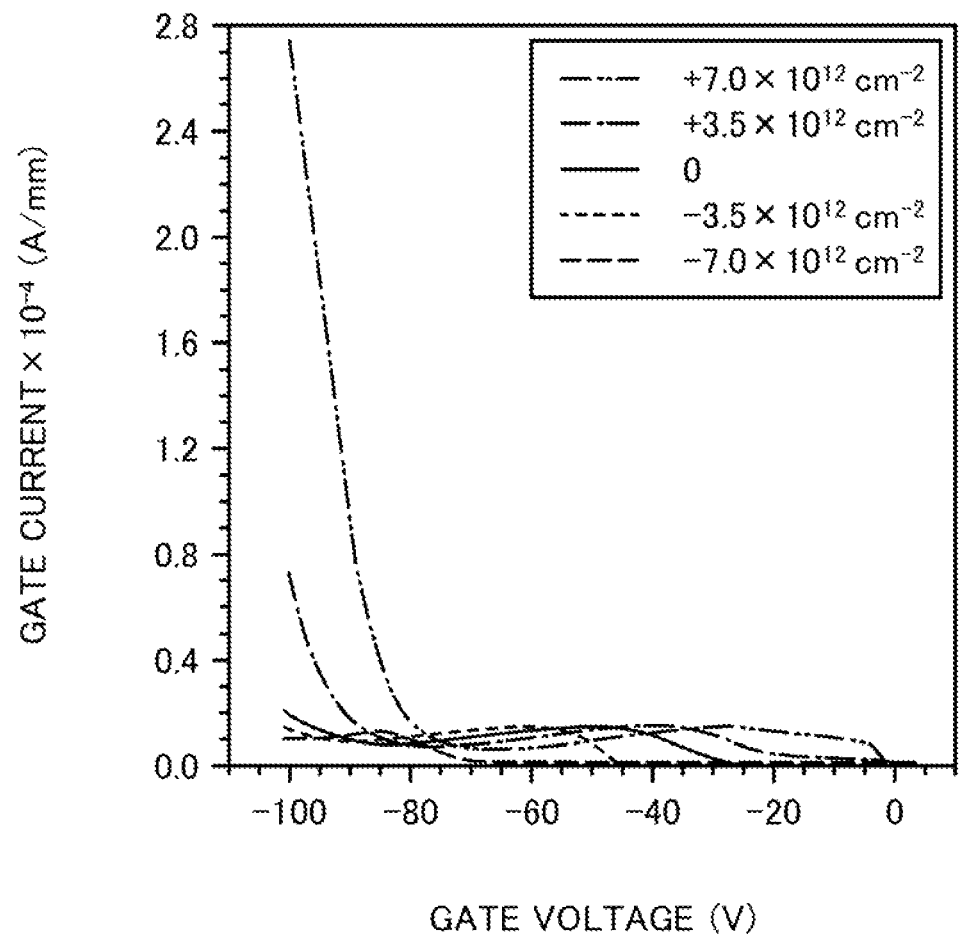
FIG. 5 is a graph (Part 2) illustrating the results of simulation according to the first embodiment.

Note that the following illustrates actions of the negative charge generation layer 131. FIGS. 4A to 4E and FIG. 5 are diagrams illustrating simulation results according to the first embodiment. According to this simulation, a distribution of field intensities (FIGS. 4A to 4E) and a relationship between gate voltage and gate current (FIG. 5) are studied, assuming that the capping layer 102f is a GaN layer with a thickness of 10 nm and that various charges are applied to a top face of the capping layer 102f instead of the negative charge generation layer 131. FIG. 4A illustrates a distribution of field intensities when the amount of positive charge (hole) is applied at a concentration of $7.0 \times 10^{12}$ cm$^{-2}$. FIG. 4B illustrates a distribution of field intensities when the amount of positive charge (hole) is applied at a concentration of $3.5 \times 10^{12}$ cm$^{-2}$. FIG. 4C illustrates a distribution of field intensities when no charge is applied. FIG. 4D illustrates a distribution of field intensities when the amount of negative charge (electron) is applied at a concentration of $3.5 \times 10^{12}$ cm$^{-2}$. FIG. 4E illustrates a distribution of field intensities when the amount of negative charge (electron) is applied at a concentration of $7.0 \times 10^{12}$ cm$^{-2}$. In addition, FIG. 5 illustrates a relationship between gate voltage and gate current, under the respective conditions corresponding to FIGS. 4A through 4E. Note that in FIG. 5, the drain is grounded.

As illustrated in FIGS. 4A to 4E, the larger the amount of positive charges, the more likely it is for a strong negative electric field to concentrate between a drain electrode side end of the umbrella portion 106b of the gate electrode 106 and the cap layer 102f. The larger the amount of negative charges, the less the electric field concentration. This means that as the amount of negative charges increases, a better drain breakdown voltage can be obtained.

As illustrated in FIG. 5, when a positive charge is applied, and a negative bias (gate voltage) is applied to the gate electrode 106, a gate current is likely to increase. By contrast, when a negative charge is applied, and a negative bias is applied to the gate electrode 106, little gate current flows. This means that the larger the amount of negative charges, the better the drain breakdown voltage may be obtained. The gate current illustrated in FIG. 5 corresponds to reverse leakage current between two terminals.

The results of these simulations clearly illustrate that the application of negative charges to the top face of the capping layer 102f improves a drain breakdown voltage. This is because the application of negative charges decreases the electron concentration near a top face of the electron transit layer 102c beneath a region where negative charges are applied, decreases the electric field intensity, and decreases the tunneling current from a drain electrode side end of the gate electrode 106.

According to the first embodiment, since the negative charge generation layer 131 is disposed on the capping layer 102f, the electron concentration near the top face of the electron transit layer 102c may be reduced in a region beneath the negative charge generation layer 131, thereby improving a drain breakdown voltage.

Second Embodiment

Figure 6:
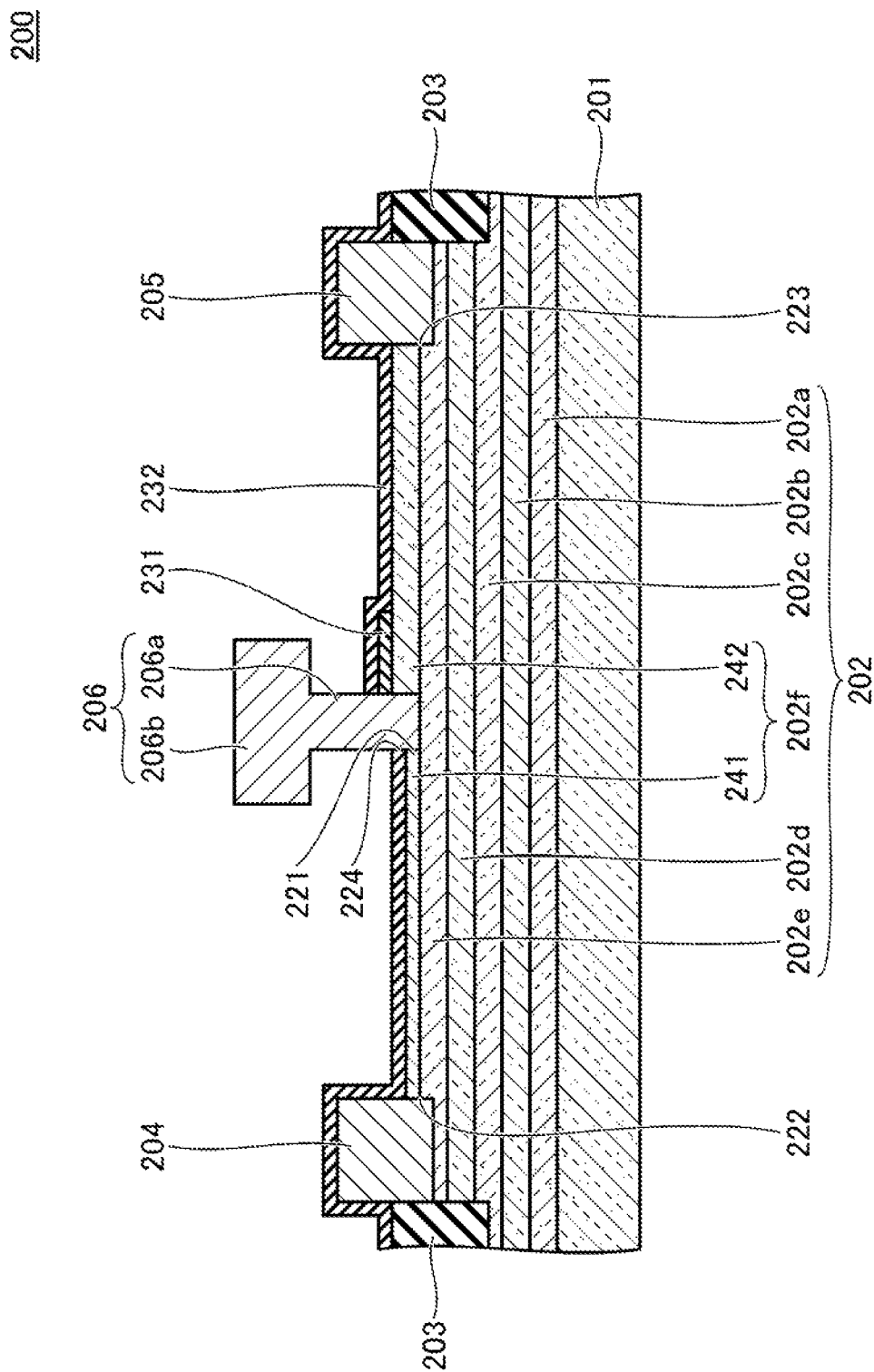
FIG. 6 is a cross-sectional view illustrating a semiconductor device according to a second embodiment.

A second embodiment will be described. The second embodiment relates to a semiconductor device including a HEMT. FIG. 6 is a cross-sectional view illustrating a semiconductor device 200 according to the second embodiment.

As illustrated in FIG. 6, in the semiconductor device 200 according to the second embodiment, a semiconductor stacked structure 202 is formed on a substrate 201, such as a semi-insulating SiC substrate. The semiconductor stacked structure 202 epitaxially grows a nucleation layer 202a, a buffer layer 202b, an electron transit layer (channel layer) 202c, an intermediate layer 202d, an electron supply layer (barrier layer) 202e, and a capping layer 202f. The semiconductor stacked structure 202 includes the nucleation layer 202a, the buffer layer 202b, the electron transit layer 202c, the intermediate layer 202d, the electron supply layer 202e, and the capping layer 202f. The nucleation layer 202a includes, for example, an AlN layer. The buffer layer 202b includes, for example, an AlGaN layer. The electron transit layer 202c includes, for example, an GaN layer (i-Gan layer) unintentionally doped with impurities. The intermediate layer 202d includes, for example, an AlN layer. The electron supply layer 202e includes, for example, an AlGaN layer or an AlN layer. The capping layer 202f includes, for example, a GaN layer.

A device separation region 203 for defining a device region is formed in the semiconductor stacked structure 202. A recess 222 for a source electrode 204, and a recess 223 for a drain electrode 205 are formed in the capping layer 202f and the electron supply layer 202e within the device region. The recesses 222 and 223 are formed partway in the electron supply layer 202e in the thickness direction, and the bottom faces of the recesses 222 and 223 are located within the electron supply layer 202e. The source electrode 204 is formed in the recess 222, and the drain electrode 205 is formed in the recess 223.

A recess 221 for the gate electrode is formed in the capping layer 202f between the recess 222 and the recess 223. The capping layer 202f has a first portion 241 and a second portion 242. The first portion 241 of the capping layer 202f is disposed between the source electrode 204 and the recess 221, and the second portion 242 of the capping layer 202f is disposed between the drain electrode 205 and the recess 221. The second portion 242 is thicker than the first portion 241. The thickness of the first portion 241 is 2 nm to 3 nm, for example. The thickness of the second portion 242 is 5 nm or more, and preferably 10 nm or more, for example. A negative charge generation layer 231 is formed on the second portion 242 of the capping layer 202f. An insulating layer 232 is formed on the semiconductor stacked structure 202 so as to cover the source electrode 204, the drain electrode 205 and the negative charge generation layer 231. An opening 224 that follows the recess 221 is formed in the insulating layer 232 in a plan view relative to the thickness direction. A gate electrode 206 is formed through the opening 224 to contact the semiconductor stacked structure 202.

The gate electrode 206, for example, has a base portion 206a and an umbrella portion 206b above the base portion 206a, such that a cross-sectional shape of the gate electrode 206 is substantially T-shaped. The dimension in the gate length direction of the base portion 206a substantially matches the dimension in the gate length direction of the recess 221. The umbrella portion 206b has a shape extending from the base portion 206a toward both the source electrode 204 and the drain electrode 205 in the gate length direction. Accordingly, the dimension in the gate length direction of the umbrella portion 206b is greater than the dimension in the gate length direction of the base portion 206a.

The negative charge generation layer 231 is disposed on the second portion 242 of the capping layer 202f to overlap an extending portion of the umbrella portion 206b in a plan view. The extending portion of the umbrella portion 206b extends from the base portion 206a toward the drain electrode 205. The negative charge generation layer 231 extends farther toward the drain electrode 205 than an end of the extending portion of the umbrella portion 206b (the end of the extending portion of the umbrella portion 206b may also be called "a drain electrode side end of the umbrella portion"). For example, a source electrode 204 side end of the negative charge generation layer 231 is in contact with the gate electrode 206, and a drain electrode 205 side end of the negative charge generation layer 231 is distant from the drain electrode 205.

A composition of the negative charge generation layer 231 deviates from a stoichiometric composition of the negative charge generation layer 231. For example, the composition of the negative charge generation layer 231 contains an excess of elements that tend to become anions or elements that have high electron affinity relative to its stoichiometric composition. For example, the negative charge generation layer 231 may contain a composition having an excess of anionic elements or elements with high electronegativity relative to its stoichiometric composition. The negative charge generation layer 231 contains more electrons than holes, and the negative charge generation layer 231 is thus negatively charged. For example, the negative charge generation layer 231 may be a silicon nitride layer composed of silicon and nitrogen. When the composition of the negative charge generation layer 231 is represented by $Si_XN_Y$, the value of X/Y is less than ¾. For example, the refractive index of the silicon nitride layer with respect to 633 nm laser light is 1.85.

By contrast, the insulating layer 232 is a stoichiometric layer, and is not charged either positively or negatively. As the insulating layer 232, for example, a silicon nitride layer having a composition represented by $Si_3N_4$ may be used. The thickness of the insulating layer 232 may be, for example, 80 nm to 120 nm.

According to the semiconductor device 200, the negative charge generation layer 231 is disposed so as to overlap the extending portion of the umbrella portion 206b in a plan view. The extending portion of the umbrella portion 206b extends from the base portion 206a toward the drain electrode 205. The negative charge generation layer 231 extends farther toward the drain electrode 205 than the end of the extending portion of the umbrella portion 206b. Thus, the density of 2DEG near the top face of the electron transit layer 202c is kept low in a region beneath the end of the extending portion of the umbrella portion 206b. Thus, according to the second embodiment, a drain breakdown voltage may be improved.

Preferably, the thickness of the negative charge generation layer 231 is 20 nm or more. When the thickness of the negative charge generation layer 231 is less than 20 nm, it may be less effective to reduce the density of 2DEG near the top face of the electron transit layer 202c.

Next, a method for fabricating the semiconductor device 200 according to the second embodiment will be described. FIGS. 7A to 10C are cross-sectional views illustrating a method for fabricating the semiconductor device 200 according to the second embodiment.

Figure 7A:
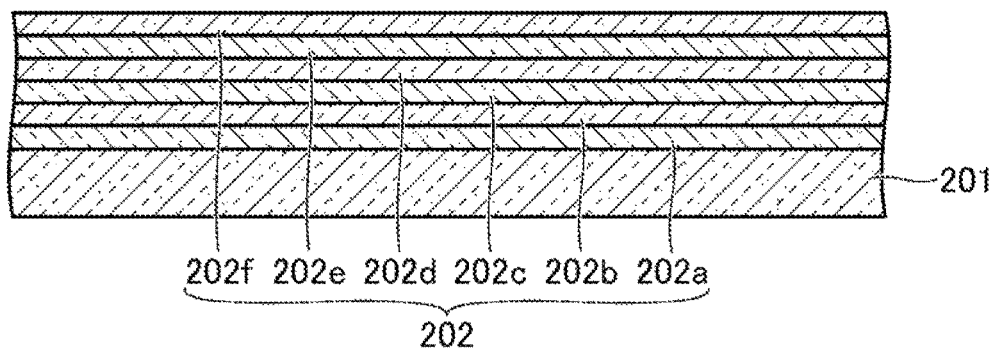
FIGS. 7A to 7C are cross-sectional views (Part 1) illustrating a method for fabricating the semiconductor device according to the second embodiment.

First, as illustrated in FIG. 7A, the nucleation layer 202a, the buffer layer 202b, the electron transit layer (channel layer) 202c, the intermediate layer 202d, the electron supply layer (barrier layer) 202e, and the capping layer 202f are epitaxially grown, by a metal organic vapor phase epitaxy (MOVPE) method, on the substrate 201 made of a semi-insulating SiC substrate and the like, for example. The nucleation layer 202a, the buffer layer 202b, the electron transit layer 202c, the intermediate layer 202d, the electron supply layer 202e, and the capping layer 202f are included in the semiconductor stacked structure 202.

As the nucleation layer 202a, an AlN layer s formed, for example. As the buffer layer 202b, an AlGaN layer is formed, for example. As the electron transit layer 202c, an GaN layer (i-Gan layer) unintentionally doped with impurities is formed, for example. As the intermediate layer 202d, an AlN layer is formed, for example. As the electron supply layer 202e, an AlGaN layer or an AlN layer is formed, for example. As the capping layer 202f, a GaN layer having a thickness of 10 nm is formed, for example.

In the formation of the semiconductor stacked structure 202, a mixture of a trimethylaluminum (TMA) gas acting as an Al source, a trimethylgallium (TMG) gas acting as a Ga source, and an ammonia ($NH_3$) gas acting as an N source may be used, for example. In this case, the presence or absence of the supply of trimethylaluminum gas and trimethylgallium gas, and flow rates of trimethylaluminum gas and trimethylgallium gas may be appropriately set, according to the composition of the compound semiconductor layer to be grown. The intermediate layer 202d between the electron transit layer 202c and the electron supply layer 202e may be formed optionally.

Figure 7B:
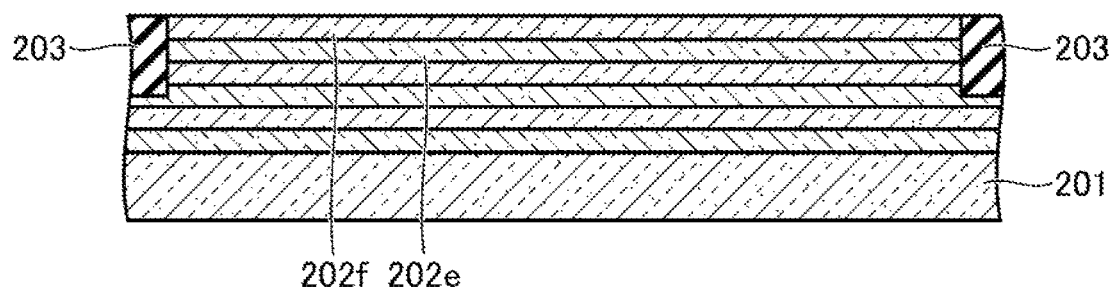

Subsequently, as illustrated in FIG. 7B, the device separation region 203, which defines a device region, is formed in the semiconductor stacked structure 202. In the formation of the device separation region 203, a photoresist pattern formed on the semiconductor stacked structure 202 to expose a region intended to form the device separation region 203, and ion implantation, such as Ar implantation, is performed using this photoresist pattern as a mask. The photoresist pattern may serve as an etching mask to perform dry etching using a chlorine-based gas. The device separation region 203 may be formed into the substrate 201.

Figure 7C:
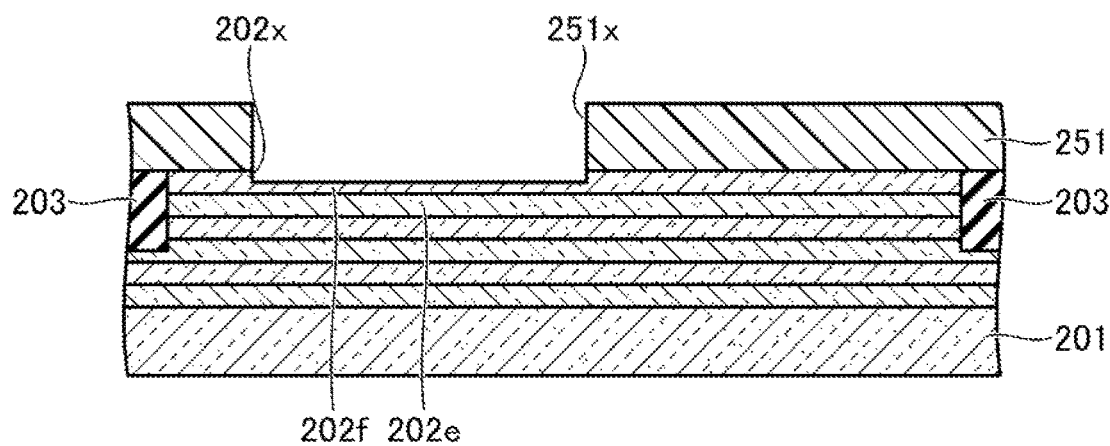

Subsequently, as illustrated in FIG. 7C, a resist pattern 251 defining an opening 251x is formed on the semiconductor stacked structure 202. The opening 251x corresponds to a region intended to form the recess 221, and a region between the region intended to form the recess 221 and a region intended to form the recess 222. Subsequently, the capping layer 202f is dry etched using the resist pattern 251 as a mask to form a recess 202x following the opening 251x in the capping layer 2021. In dry etching of the capping layer 202f, a chlorine-based gas such as an inert gas and a $Cl_2$ gas are used as etching gases, for example. The remaining thickness of the capping layer 202f is, for example, 2 nm to 3 nm.

The resist pattern. 251 is then removed using a heated organic solvent, as illustrated in FIG. SA. A resist pattern 252 defining an opening 252g is then formed on the semiconductor stacked structure 202. The opening 252g corresponds to a region intended to form a recess 221. The dimension in the gate length direction of the opening 252g is, for example, 0.23 µm to 0.27 µm. Subsequently, the capping layer 202f is dry etched using the resist pattern 252 as a mask to form the recess 221 following the opening 252g in the capping layer 202f. The recess 221 is connected to the recess 202x. In dry etching of the capping layer 202f, for example, an inert gas and a chlorine-based gas such as a $Cl_2$ gas are used as etching gases.

Figure 8A:
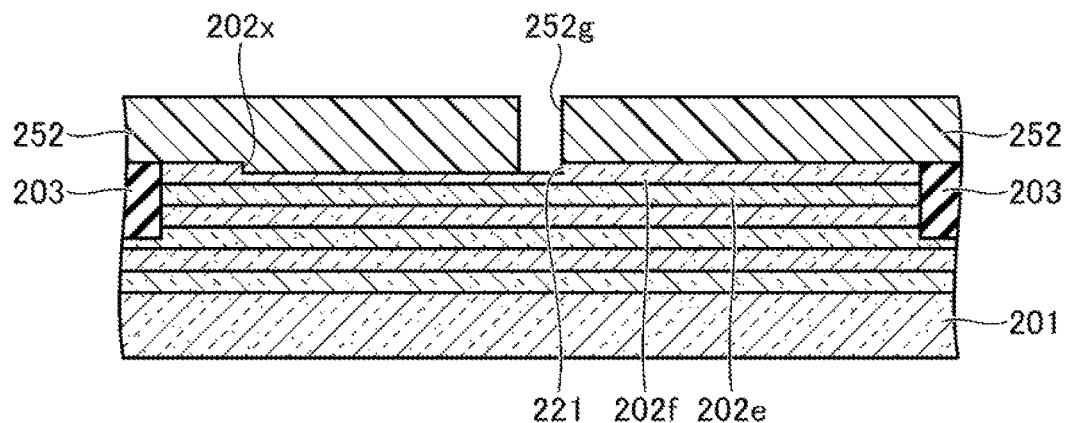
FIGS. 8A to 8C are cross-sectional views (Part 2) illustrating a method for fabricating the semiconductor device according to the second embodiment.
Figure 8B:
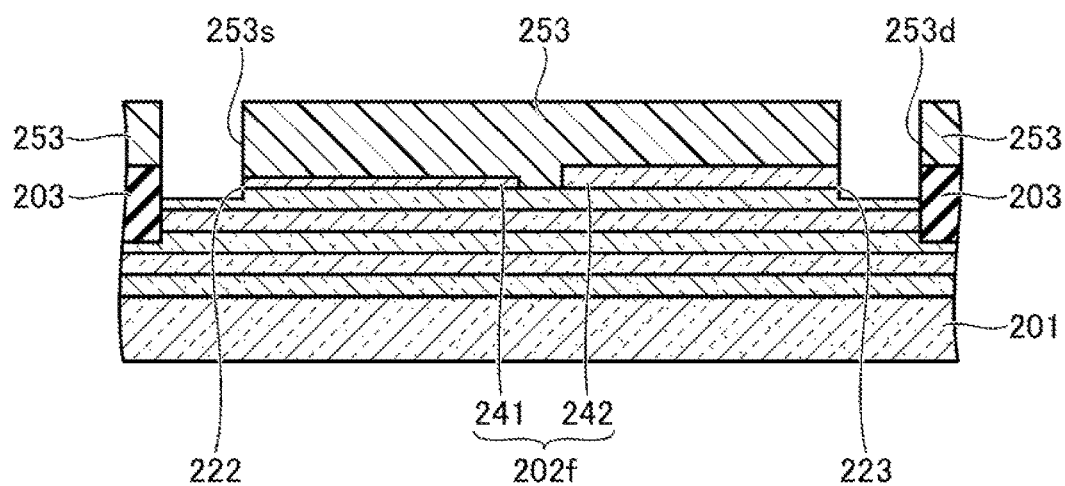
Figure 8C:
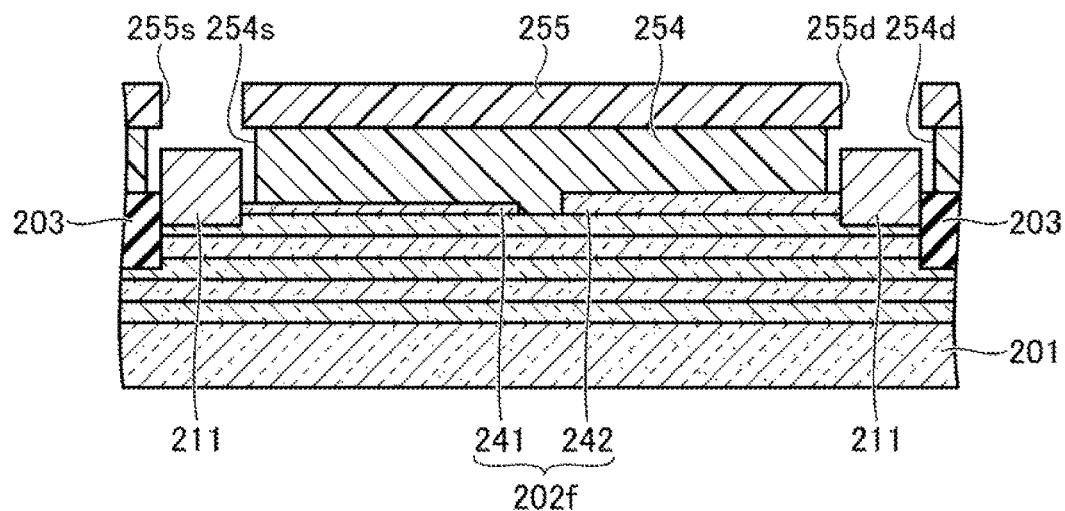

The resist pattern 252 is then removed using a heated organic solvent, as illustrated in FIG. 8B. A resist pattern 253 is then formed on the semiconductor stacked structure 202 defining an opening 253s corresponding to a region intended to form the recess 222 and an opening 253d corresponding to a region intended to form the recess 223. Subsequently, the capping layer 202f and the electron supply layer 202e are dry etched using the resist pattern 253 as a mask to form the recess 222 following an opening 253s and the recess 223 following an opening 253d in the capping layer 202f and the electron supply layer 202e. In forming the recesses 222 and 223, respective portions of the electron supply layer 202e are left in the thickness direction. That is, dry etching is performed such that respective bottom faces of the recesses 222 and 223 are disposed within the electron supply layer 202e. The recess 222 follows the recess 202x. In dry etching of the capping layer 202f and the electron supply layer 202e, for example, inert gases and chlorine-based gases such as a $Cl_2$ gas are used as etching gases. The portion of the capping layer 202f between the recess 221 and the recess 222 serves as a first portion 241, and the portion of the capping layer 202f between the recess 221 and the recess 223 becomes a second portion 242.

The resist pattern 253 is then removed using a heated organic solvent as illustrated in FIG. 8G. A two-layered resist pattern that includes a resist pattern 254 and a resist pattern 255 layered in this order, is then formed on the semiconductor stacked structure 202. The resist pattern 254 has an opening 254s corresponding to a region intended to form the source electrode 204 and an opening 254d corresponding to a region intended to form the drain electrode 205. The resist pattern 255 has an opening 255s corresponding to a region intended to form the source electrode 204 and an opening 255d corresponding to a region intended to form the drain electrode 205. In this manner, an eaves structure (setback structure) is formed. Subsequently, the resist patterns 254 and 255 are used as masks to form respective metal films 211 inside the recess 222 and the recess 223. In the formation of the metal films 211, for example, a Ti layer is formed by a high vacuum evaporation process and an Al layer is formed on top of the Ti layer by a high vacuum evaporation process. For example, the Ti layer may be 10 nm to 30 nm thick, and the Al layer may be 100 nm to 300 nm thick. Although illustration is omitted, a metal film 211 is also formed on the resist pattern 255.

Figure 9A:
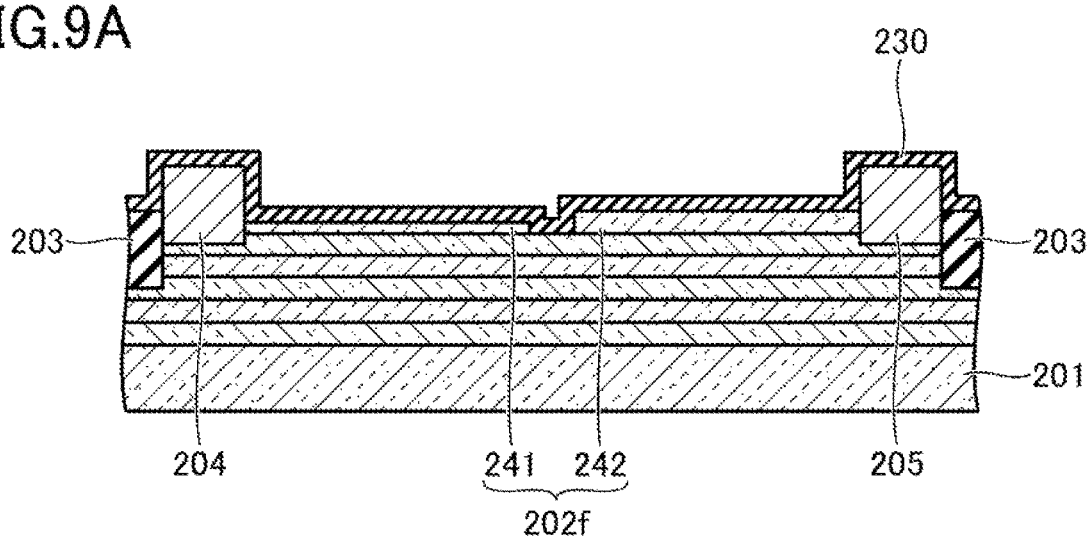
FIGS. 9A to 9C are cross-sectional views (Part 3) illustrating a method for fabricating the semiconductor device according to the second embodiment.
Figure 9B:
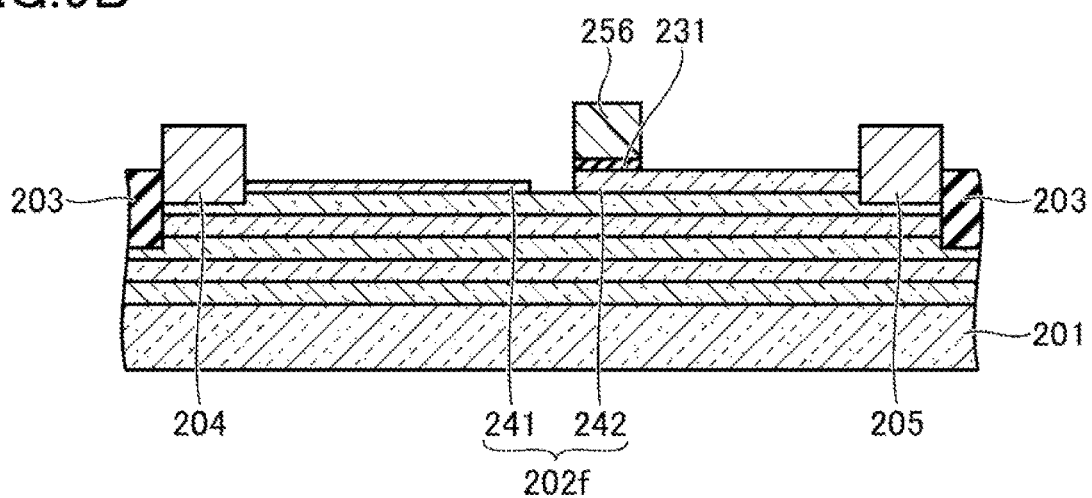

Subsequently, the resist patterns 254 and 255 are removed together with the metal film 211 formed on the resist pattern 255, as illustrated in FIG. 9A. As a result, the source electrode 204 is formed inside the recess 222, and the drain electrode 205 is formed inside the recess 223. As described above, the formation of the source and drain electrodes 204 and 205 may employ, for example, deposition and lift-off techniques. Thereafter, heat treatment (alloying treatment) is performed at 550° C. to 650° C. to make ohmic contact between the surface of the semiconductor stacked structure 202 and each of the source and drain electrodes 204 and 205. A layer 230 that is negatively charged and covers the source electrode 204 and the drain electrode 205 is then formed on the semiconductor stacked structure 202. The layer 230 may be made of, for example, a silicon nitride layer having a refractive index of 1.85 with respect to a 633 nm laser beam. The layer 230 may be formed by, for example, a chemical vapor deposition process using a $SiH_4$ gas and a $NH_3$ gas as a raw gas, and a $N_2$ as a carrier gas.

As illustrated in FIG. 95, a resist pattern 256 covering a region intended to form the negative charge generation layer 231 is then formed on the layer 230. The resist pattern 256 is then used as a mask to dry etch the layer 230 to remove portions of the layer 230 that are exposed from the resist pattern 256. As a result, the negative charge generation layer 231 is selectively formed on the capping layer 202f.

Figure 9C:
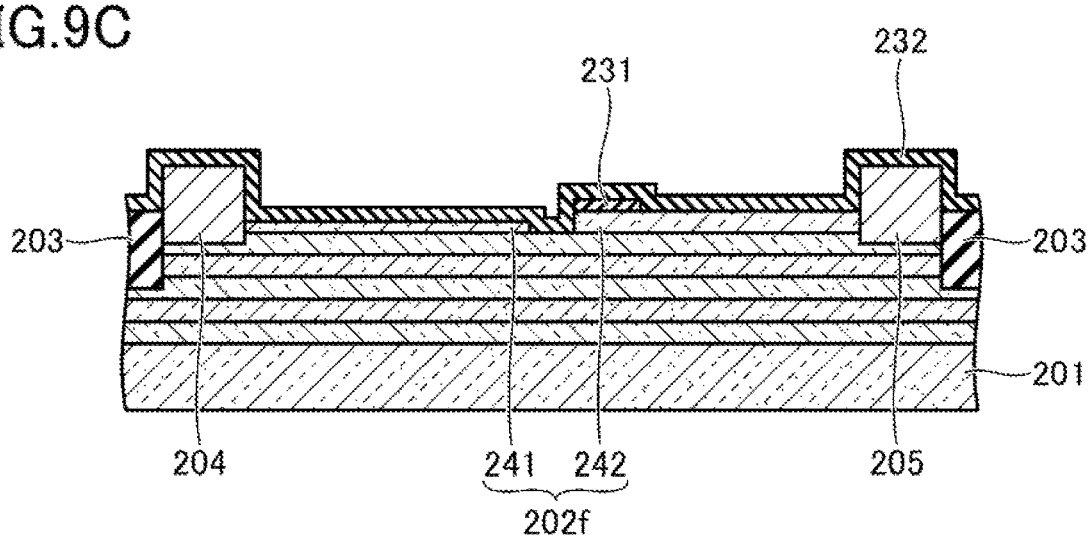

The resist pattern 256 is then removed using a heated organic solvent, as illustrated in FIG. 9C. Thermal treatment is then performed at 600° C. for one minute to reduce the electron concentration near the top face of the electron transit layer 202c beneath the negative charge generation layer 231. An insulating layer 232 is then formed on the semiconductor stacked structure 202 so as to cover the source electrode 204, the drain electrode 205, and the negative charge generation layer 231. As the insulating layer 232, a silicon nitride layer having a composition represented by $Si_3N_4$ may be used. The insulating layer 232 may be formed by a plasma CVD process, for example, using a $SiH_4$ gas and a $NH_3$ gas as a raw gas, and a $N_2$ gas as a carrier gas.

Figure 10A:
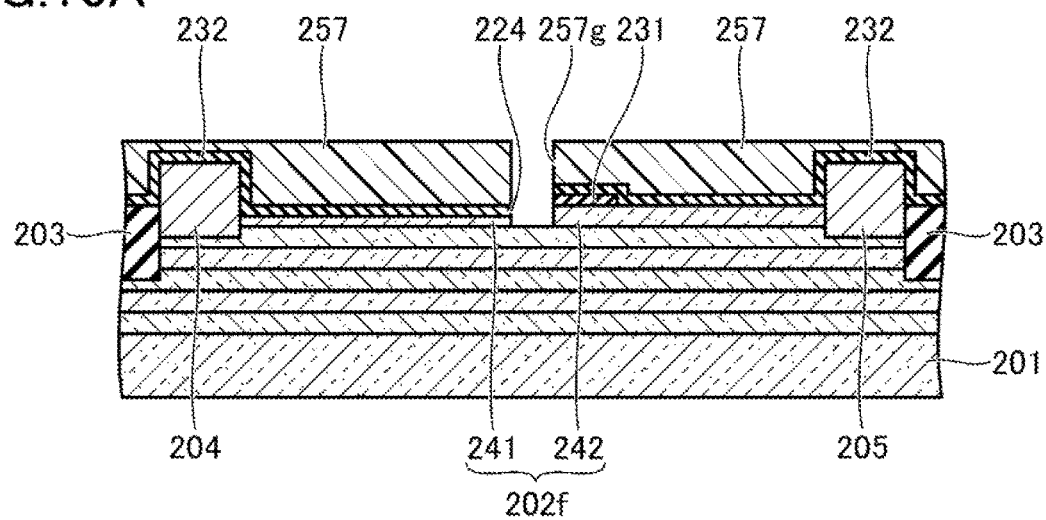
FIGS. 10A to 10C are cross-sectional views (Part 4) illustrating a method for fabricating the semiconductor device according to the second embodiment.

A resist pattern 257 having an opening 257g corresponding to a region intended to form an opening 224 is then formed on the insulating layer 232, as illustrated in FIG. 10A. The dimension in the gate length direction of the opening 257g is, for example, 0.23 μm to 0.27 μm. Thereafter, the resist pattern 257 is used as a mask to dry etch the insulating layer 232 to form the opening 224 following the opening 257g in the insulating layer 232. For example, the opening 224 is formed to overlap the recess 221 (see FIG. 8A) in a plan view. In dry etching of the insulating layer 232, for example, $SF_6$ is used as an etching gas.

Figure 10B:
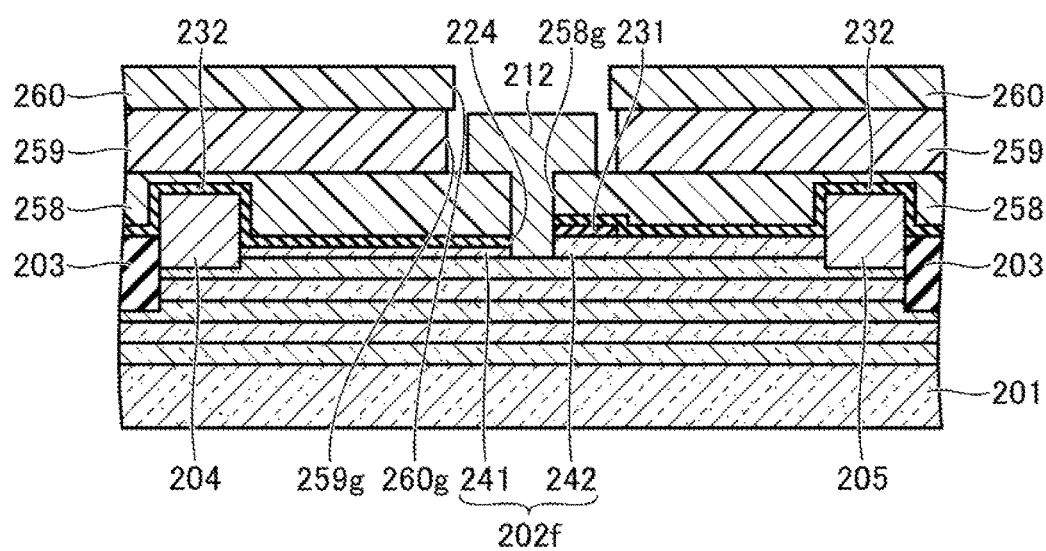

Subsequently, the resist pattern 257 is removed using a heated organic solvent, as illustrated in FIG. 10B. A three-layer resist pattern is then formed on the insulating layer 232. The three-layer resist pattern includes a resist pattern 258, a resist pattern 259, and a resist pattern 260 that are layered in this order on the insulating layer 232. The resist pattern 258 has an opening 258g corresponding to a region intended to form the gate electrode 206. The resist, pattern 259 has an opening 259g corresponding to a region intended to form the gate electrode 206. The resist pattern 260 has an opening 260g corresponding to a region intended to form the gate electrode 206.

In the formation of the resist patterns 258 to 260, a three-layered resist layer is first formed by repeating of application and prebaking a resist layer by the spin-coating process three times. An opening 260g is then formed in an uppermost resist layer of the three-layered resist layer to complete the resist pattern 260. The dimension in the gate length direction of the opening 260g is, for example, 0.8 μm to 1.2 μm. Subsequently, an opening 259g is formed in an intermediate resist layer of the three-layered resist layer using the resist pattern 260 as a mask to complete the resist pattern 259 having an eaves structure (setback structure). The dimension in the gate length direction of the eaves structure relative to the resist pattern 260 is, for example, 0.3 μm to 0.7 μm. Subsequently, an opening 258g is formed in a lowermost resist layer of the three-layered resist layer to complete the resist pattern 258. The dimension in the gate length direction of the opening 258g is, for example, 0.2 μm to 0.3 μm. For example, polymethylmethacrylate (PMMA) manufactured by U.S. MicroChem, Inc., may be used as a material for the resist pattern 258. For example, polydimethylglutarimide (PMGI) manufactured by U.S. MicroChem, Inc., may be used as a material for the resist pattern 259. For example, ZEP-520 manufactured by Zeon Corporation may be used as a material for the resist pattern 260. These resist materials may be applied by the spin-coating process, and prebaking is performed after the application of the resist materials. In the exposure to form the opening 260g, electron beam lithography may be performed with a length of 1.0 μm to 1.5 μm in the gate length direction, and ZEP-SD manufactured by Zeon Corporation may be used as a developer, for example. In the formation of the opening 259g, NMD-W manufactured by Tokyo Ohka Kogyo Co., Ltd. may be used as a developer, for example. In the exposure to form the opening 258g, electron beam lithography is performed with a length of 0.2 μm to 0.3 μm in the gate length direction, and ZMD-B manufactured by Zeon. Corporation may be used as a developer, for example.

Thereafter, as also illustrated in FIG. 10B, a metal film 212 is formed on the resist pattern 258 inside the opening 259g and the opening 260g. The metal film 212 thus contacts the semiconductor stacked structure 202 through the opening 258g and the opening 224. In the formation of the metal film 212, for example, a Ni layer is formed by a high vacuum deposition process, and an Au layer is formed on top of the Ni layer by a high vacuum deposition process. For example, the Ni layer may be 10 nm to 30 nm thick, and the Au layer may be 200 nm to 400 nm thick. Although illustration is omitted, the metal film 212 is also formed on the resist pattern 260.

Figure 10C:
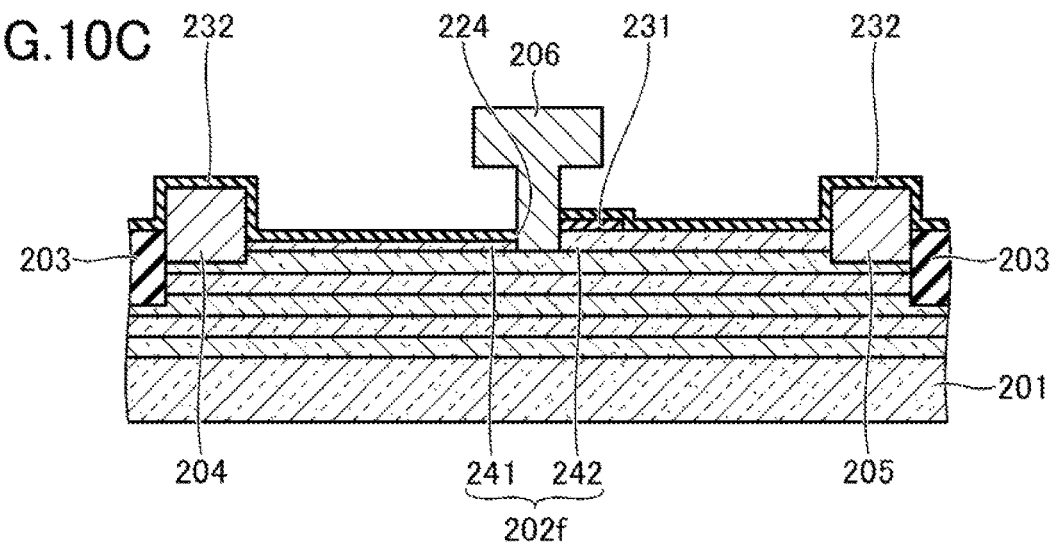

Subsequently, as illustrated in FIG. 10C, the resist patterns 258 to 260 are removed together with the metal film 212 formed on the resist pattern 260. As a result, a gate electrode 206 is formed through the opening 224 to contact the semiconductor stacked structure 202. As described above, deposition and liftoff techniques may be used in the formation of the gate electrode 206, for example.

Thereafter, a protective film and interconnects are formed as necessary to complete the semiconductor device 200.

Figure 11:
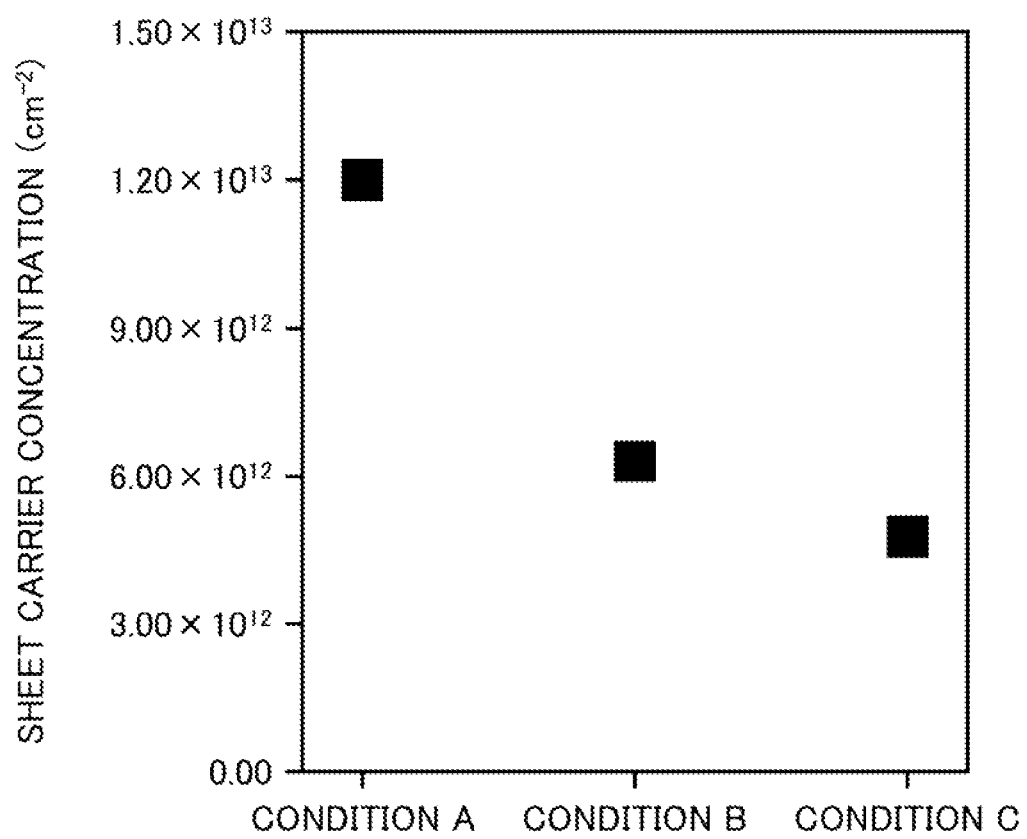
FIG. 11 is a graph illustrating a relationship between a material of a negative charge generation layer and sheet carrier concentration.

FIG. 11 is a diagram illustrating a relationship between a material for the negative charge generation layer and sheet carrier concentration. In condition A, a stoichiometric silicon nitride layer having a composition represented by $Si_3N_4$ is used instead of the negative charge generation layer. In condition B, a N-rich silicon nitride layer is used as the negative charge generation layer. In condition C, an O-rich aluminum oxide layer is used as the negative charge generation layer. According to conditions B and C, the sheet carrier concentration may be reduced by ½ or less compared to condition A. As described above, the use of the negative charge generation layer that is negatively charged significantly reduces the sheet carrier concentration and provides an excellent drain breakdown voltage.

Figure 12A:
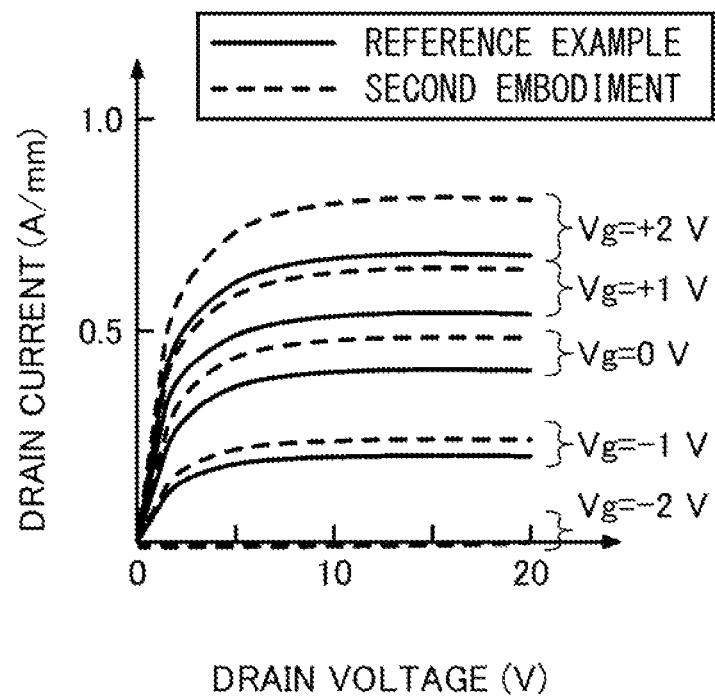
FIGS. 12A and 12B are graphs each illustrating a relationship between a drain voltage and a drain current of the semiconductor device fabricated according to simulation of the second embodiment.
Figure 12B:
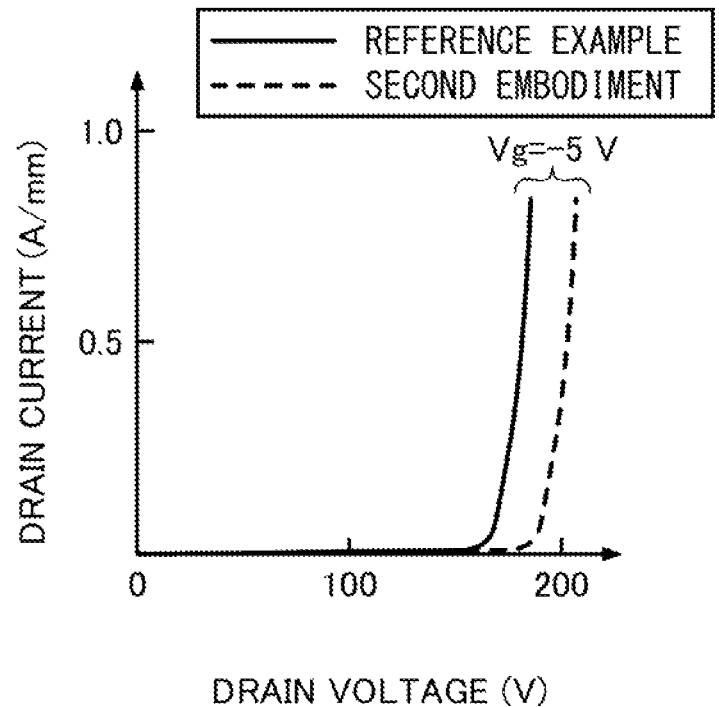

FIGS. 12A and 12B illustrate characteristics of three terminals in a semiconductor device, which is fabricated according to the second embodiment. FIG. 12A illustrates a relationship between a drain voltage and a drain current where the drain voltage is 0 V to 20 V, and the gate voltage Vg is −2V, −1V, 0V, +1V, and +2V. FIG. 12B illustrates a relationship between a drain voltage and a drain current where the drain voltage is 0 V to 200 V, and the gate voltage Vg is −5V. FIGS. 12A and 12B also illustrate characteristics of three terminals according to the reference example having a structure in which the negative charge generation layer 231 is removed from the structure of the second embodiment.

As illustrated in FIGS. 12A and 12B, the semiconductor device fabricated according to the second embodiment may reduce on-resistance, may increase the drain current, and may improve the drain breakdown voltage. This enables the amplifier, to which the semiconductor device is applied, to achieve high output power and high efficiency.

Third Embodiment

A third embodiment will be described. The third embodiment differs from the second embodiment in terms of the structure of the second portion 242 of the capping layer 102f. FIG. 13 is a cross-sectional view illustrating a semiconductor device 300 according to a third embodiment.

As illustrated in FIG. 13, in the semiconductor device 300 according to the third embodiment, the second portion 242 includes a third portion 242a overlapping the negative charge generation layer 231 in a plan view, and a fourth portion 212b disposed between the third portion 242a and the drain electrode 205. The third portion 242a is thicker than the first portion 241. The thickness of the fourth portion 242b is equivalent to the thickness of the first portion 241. For example, the thicknesses of the first portion 241 and the fourth portion 242b may be 2 nm to 3 nm, whereas the thickness of the third portion 242a may be 5 nm or more, and may preferably be 10 nm or more.

Other configurations are similar to those of the second embodiment.

The same effect as the second embodiment may be obtained by the third embodiment.

Comparing the second embodiment and the third embodiment, for example, the second embodiment is preferable in view of the drain breakdown voltage, and the third embodiment is preferable in view of the electron mobility.

Figure 14A:
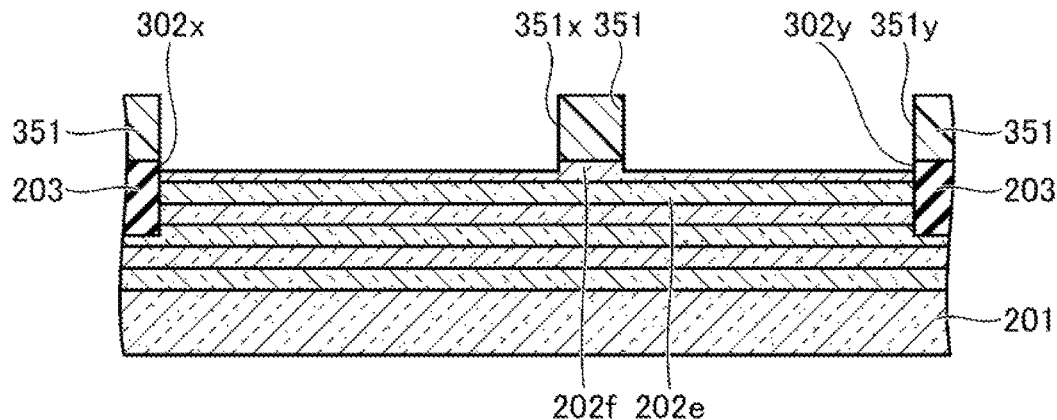
FIGS. 14A to 14C are cross-sectional views illustrating a method for fabricating a semiconductor device according to the third embodiment.
Figure 14B:
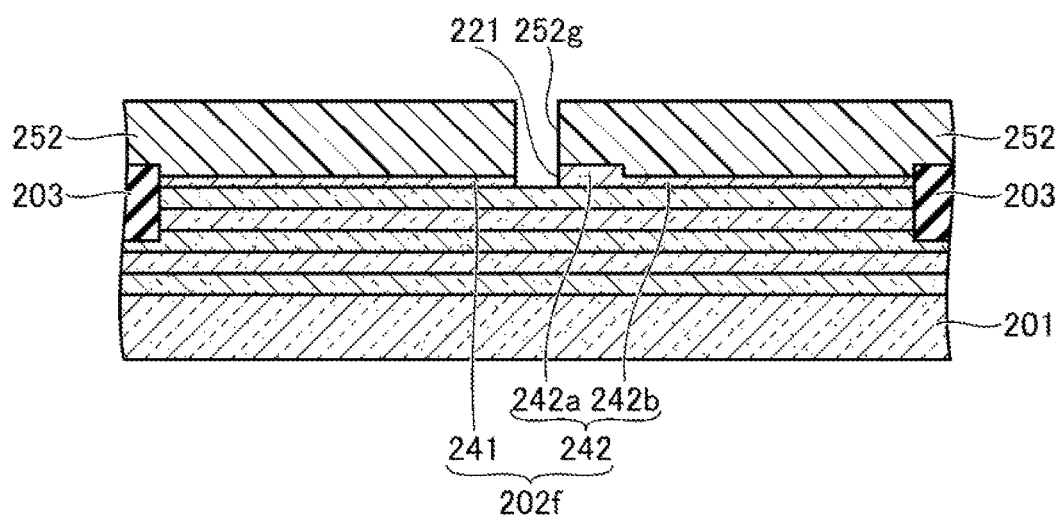
Figure 14C:
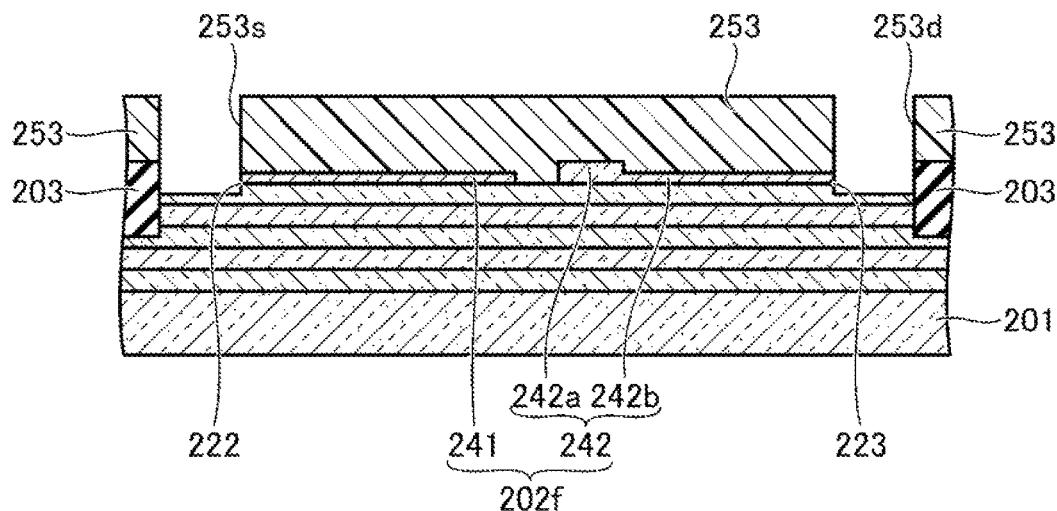

Next, a method for fabricating the semiconductor device 300 according to the third embodiment will be described. FIGS. 14A to 14C are cross-sectional views illustrating a method for fabricating the semiconductor device 300 according to the third embodiment.

First, the process up to the formation of the device separation region. 203 is performed in the same manner as in the second embodiment (see FIG. 7B). Subsequently, a resist pattern 351 having openings 351x and 351y is formed on the semiconductor stacked structure 202, as illustrated in FIG. 14A. The opening 351x corresponds to a region intended to form the recess 221, a region intended to form the recess 222, and a region between these regions for the recesses 221 and 222. The opening 351y corresponds to a region intended to form the recess 223, and a region between the region intended to form the recess 221 and a region intended to form the recess 223. Thereafter, the capping layer 202f is dry etched using the resist pattern 351 as a mask to form a recess 302x following the opening 351x and a recess 302y following the opening 351y in the capping layer 202f. In dry etching of the capping layer 202f, for example, an inert gas and a chlorine-based gas such as a $Cl_2$ gas are used as the etching gases. The remaining thickness of the capping layer 202f is, for example, 2 nm to 3 nm.

The resist pattern 351 is then removed using a heated organic solvent, as illustrated in FIG. 14B. A resist pattern 252 defining an opening 252g is then formed on the semiconductor stacked structure 202. Subsequently, as in the second embodiment, the capping layer 202f is dry etched using the resist pattern 252 as a mask to form a recess 221 following the opening 252g on the capping layer 202f. The recess 221 is connected to the recess 302x.

Thereafter, the resist pattern 252 is removed using a heated organic solvent as illustrated in FIG. 14C. Subsequently, a resist pattern 253 having openings 253s and 253d is formed on the semiconductor stacked structure 202. The resist pattern 253 is then used as a mask to dry etch the capping layer 202f and the electron supply layer 202e. As a result, the recess 222 following the opening 253s and the recess 223 following the opening 253d are formed in the capping layer 202f and the electron supply layer 202e. As in the second embodiment, in forming the recesses 222 and 223, respective portions of the electron supply layer 202e are left in the thickness direction. The recess 222 is connected to the recess 302x, and the recess 223 is connected to the recess 302y. The portion of the capping layer 202f between the recess 221 and the recess 222 serves as a first portion 241, and the portion of the capping layer 202f between the recess 221 and the recess 223 becomes a second portion 242. The second portion 242 has a higher portion and a lower portion, where the higher portion becomes a third portion 242a and the lower portion becomes a fourth portion 242b, as illustrated in FIG. 14C.

Thereafter, in the same manner as in the second embodiment, the resist pattern 253 is removed, and a subsequent process is performed to complete the semiconductor device 300.

Fourth Embodiment

Figure 15:
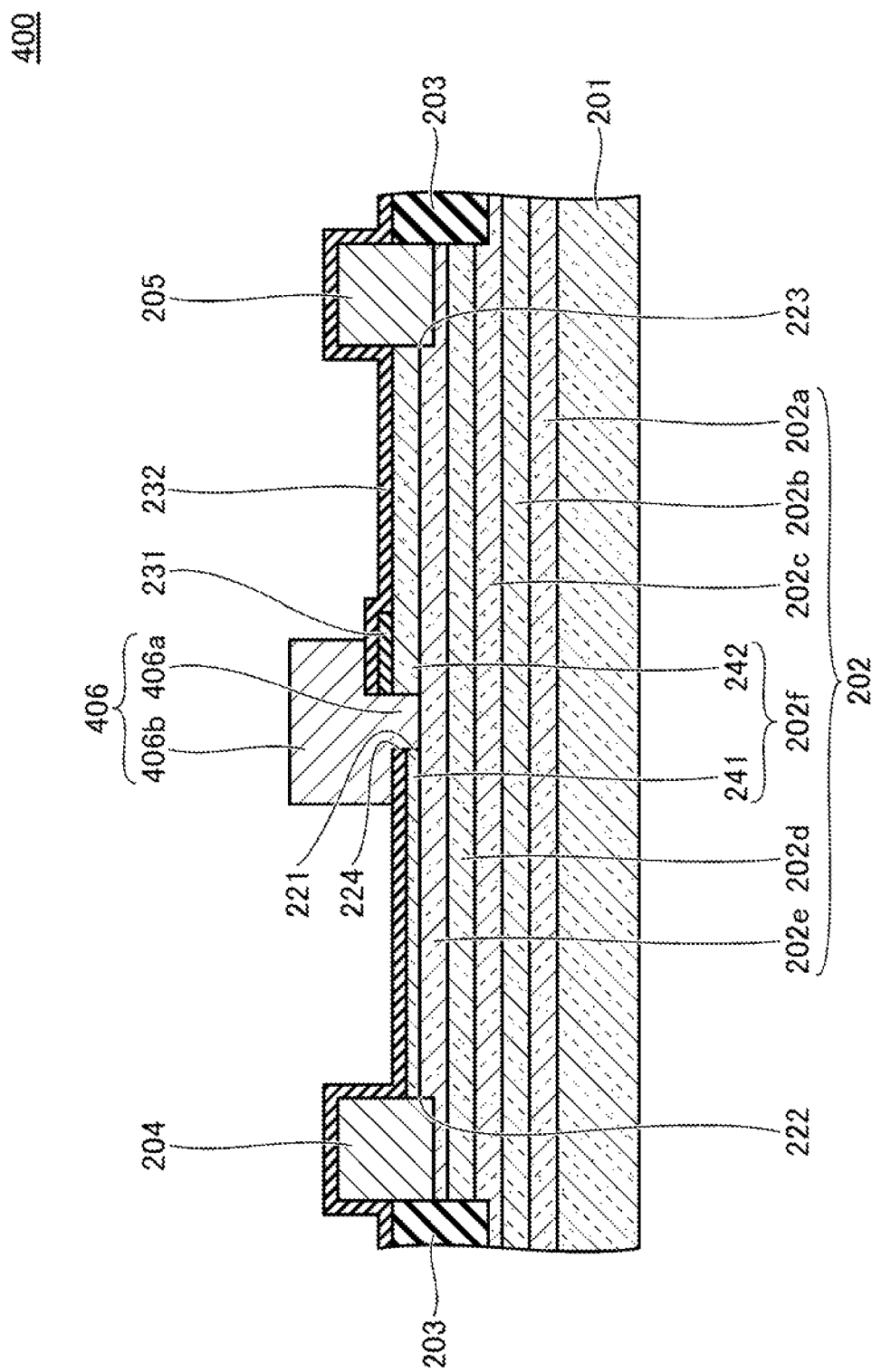
FIG. 15 is a cross-sectional view illustrating a semiconductor device according to a fourth embodiment.

A fourth embodiment will be described. The fourth embodiment differs from the second embodiment in terms of the structure of the gate electrode. FIG. 15 is a cross-sectional view illustrating a semiconductor device 400 according to a fourth embodiment.

In the semiconductor device 400 according to the fourth embodiment, a gate electrode 406 is disposed instead of the gate electrode 206, as illustrated in FIG. 15. The gate electrode 406 has a base portion 406a and an umbrella portion 406b above the base portion 406a. A bottom face of the umbrella portion 406b is in contact with a top face of the insulating layer 232. The dimension in the gate length direction of the base portion 406a substantially matches the dimension in the gate length direction of the recess 221. The umbrella portion 406b has a shape extending in a gate length direction from the base portion 406a toward the source electrode 204 and the drain electrode 205. Thus, the dimension in the gate length direction of the umbrella portion 406b is greater than the dimension in the gate length direction of the base portion 406a.

Other configurations are similar to those of the second embodiment.

The fourth embodiment may obtain the same effect as the second embodiment.

Figure 16A:
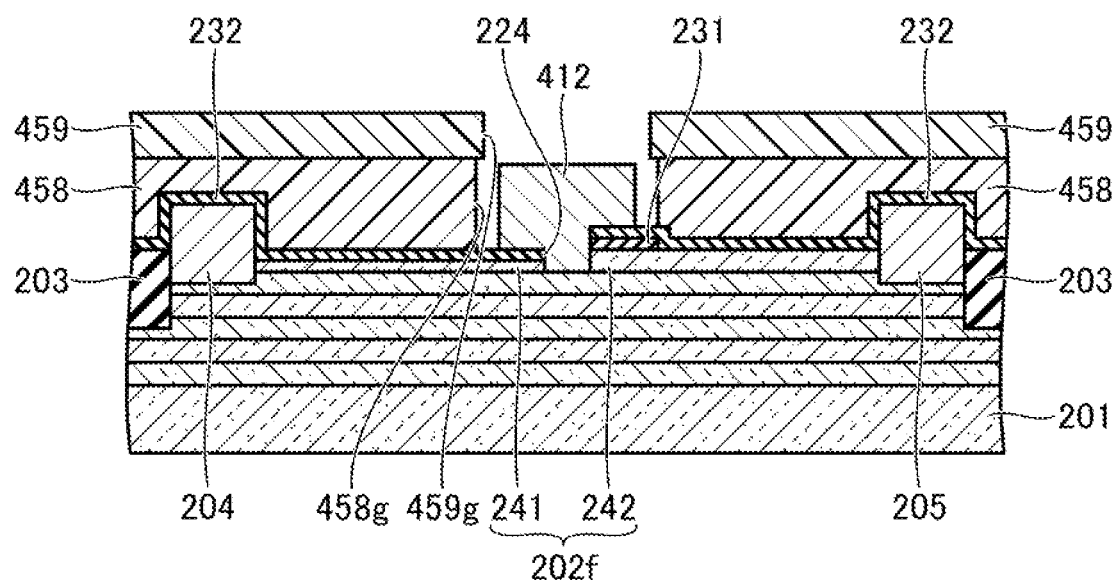
FIGS. 16A and 16B are cross-sectional views each illustrating a method for fabricating a semiconductor device according to a fourth embodiment.
Figure 16B:
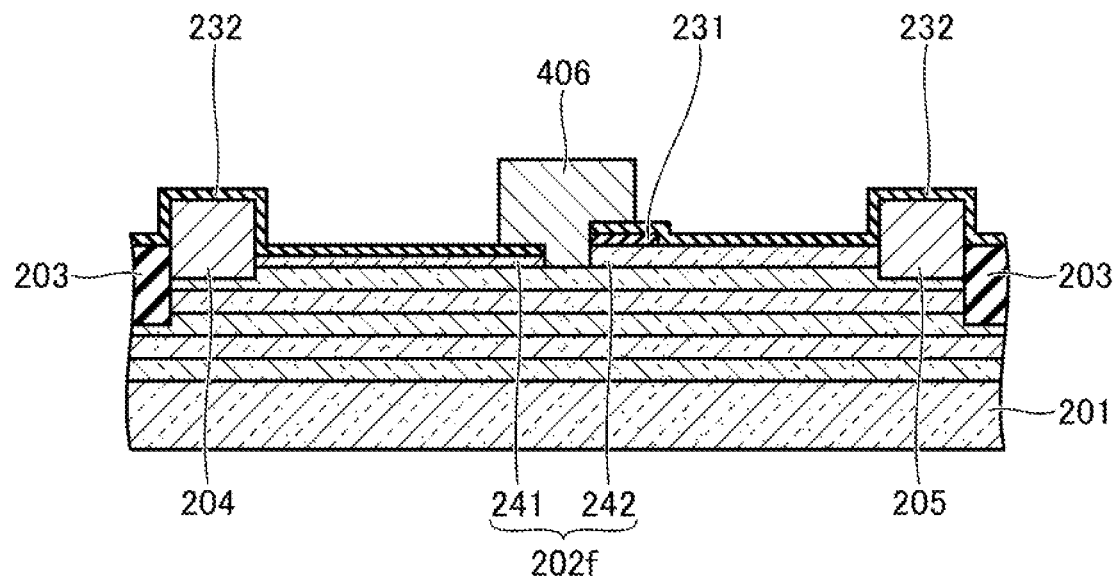

Next, a method for fabricating the semiconductor device 400 according to the fourth embodiment will be described. FIGS. 16A and 16B are cross-sectional views illustrating a method for fabricating the semiconductor device 400 according to the fourth embodiment.

First, in the same manner as in the second embodiment, the process up to the formation of the opening 224 is performed using the resist pattern 257 (see FIG. 10A). The resist pattern 257 is then removed using a heated organic solvent, as in the second embodiment. Then, as illustrated in FIG. 16A, a two-layered resist pattern having a resist pattern 458 and a resist pattern 459 on the resist pattern 458 is formed on the insulating layer 232. The resist pattern 458 has an opening 458g corresponding to a region intended to form the gate electrode 406. The resist pattern 459 has an opening 459g corresponding to a region intended to form the gate electrode 406.

In the formation of the resist patterns 458 and 459, a two-layered resist layer is first formed by repeating of application and prebaking a resist layer by the spin-coating process twice. An opening 459g is then formed in an upper resist layer of the two-layered resist layer to form the resist pattern 459. Subsequently, an opening 458g is formed in a lower resist layer of the two-layered resist layer using the resist pattern 459 as mask to form a resist pattern 458 having a setback structure with a dimension in the gate length direction of 0.3 µm to 0.7 µm relative to the resist pattern 459. For example, polydimethylglutarimide (PMGI) manufactured by U.S. MicroChem Inc., may be used as a material for the resist pattern 458, and ZEP-520 manufactured by Zeon Corporation may be used as a material for the resist pattern 459. These resist materials may be applied by the spin-coating process, and prebaking is performed after the application of the resist materials. In the exposure to form the opening 459g, electron beam lithography is performed, for example, with the length of 1.0 µm to 1.5 µm in the gate length direction. In the formation of the opening 459g, ZEP-SD manufactured by Zeon Corporation may be used as a developer. In the formation of the opening 458g, NMD-W manufactured by Tokyo Ohka Kogyo Co., Ltd. may be used as a developer.

Thereafter, as also illustrated in FIG. 16A, a metal film 412 is formed on the insulating layer 232, inside the openings 458g and 459g such that the metal film 412 contacts the semiconductor stacked structure 202 through the opening 224. In the formation of the metal film 412, for example, a Ni layer is formed by the high vacuum evaporation process, and an Au layer is formed on top of the Ni layer by the high vacuum evaporation process. For example, the Ni layer may be 10 nm to 30 nm thick, and the Au layer may be 200 nm to 400 nm thick. Although illustration is omitted, the metal film 412 is also formed on the resist pattern 459.

The resist patterns 458 and 459 are then removed together with the metal film 412 on the resist pattern 459, as illustrated in FIG. 16B, As a result, a gate electrode 406 is formed through the opening 224 to contact the semiconductor stacked structure 202. Thus, deposition and liftoff techniques may be used in the formation of the gate electrode 406, for example.

Fifth Embodiment

Figure 17:
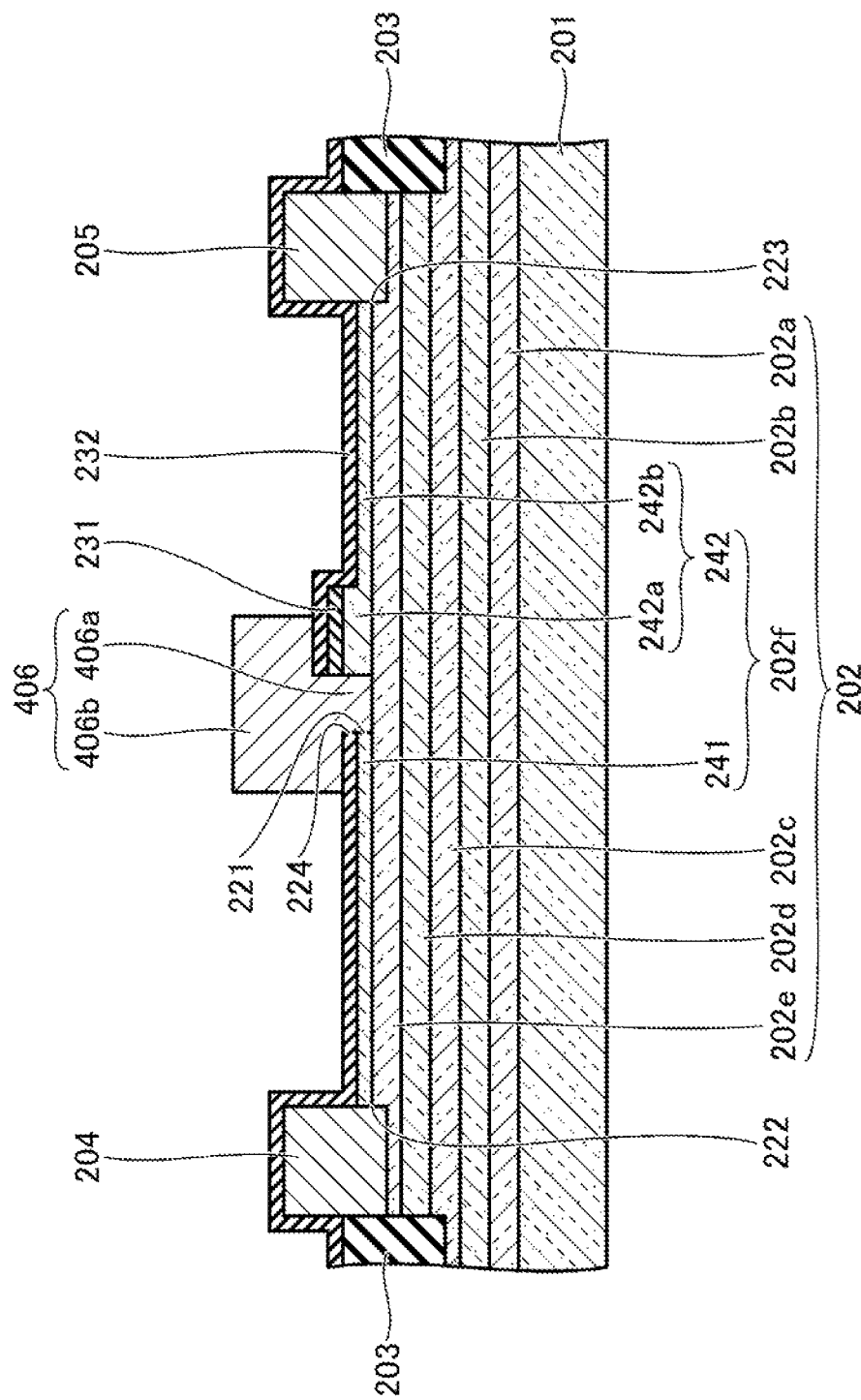
FIG. 17 is a cross-sectional view illustrating a semiconductor device according to a fifth embodiment.

A fifth embodiment will be described. A fifth embodiment differs from the fourth embodiment in terms of the structure of the second portion 242 of the capping layer 202f. FIG. 17 is a cross-sectional view illustrating a semiconductor device 500 according to a fifth embodiment.

As illustrated in FIG. 17, in the semiconductor device 500 according to the fifth embodiment, the second portion 242 includes a third portion 242a overlapping the negative charge generation layer 231 in a plan view, and a fourth portion 242b disposed between the third portion 242a and the drain electrode 205, in a manner similar to the third embodiment. The third portion 242a is thicker than the first portion 241. The thickness of the fourth portion 242b is equivalent to the thickness of the first portion 241. For example, the thicknesses of the first portion 241 and the fourth portion 242b may be 2 nm to 3 nm, whereas the thickness of the third portion 242a may be 5 nm or more, and may preferably be 10 nm or more.

Other configurations are similar to those of the fourth embodiment.

The fifth embodiment may obtain the same effect as the fourth embodiment.

The semiconductor device 500 according to the fifth embodiment may be fabricated, for example, by combining the method for fabricating the semiconductor device 400 with the method for forming the capping layer 202f in the method for fabricating the semiconductor device 300.

Sixth Embodiment

Figure 18:
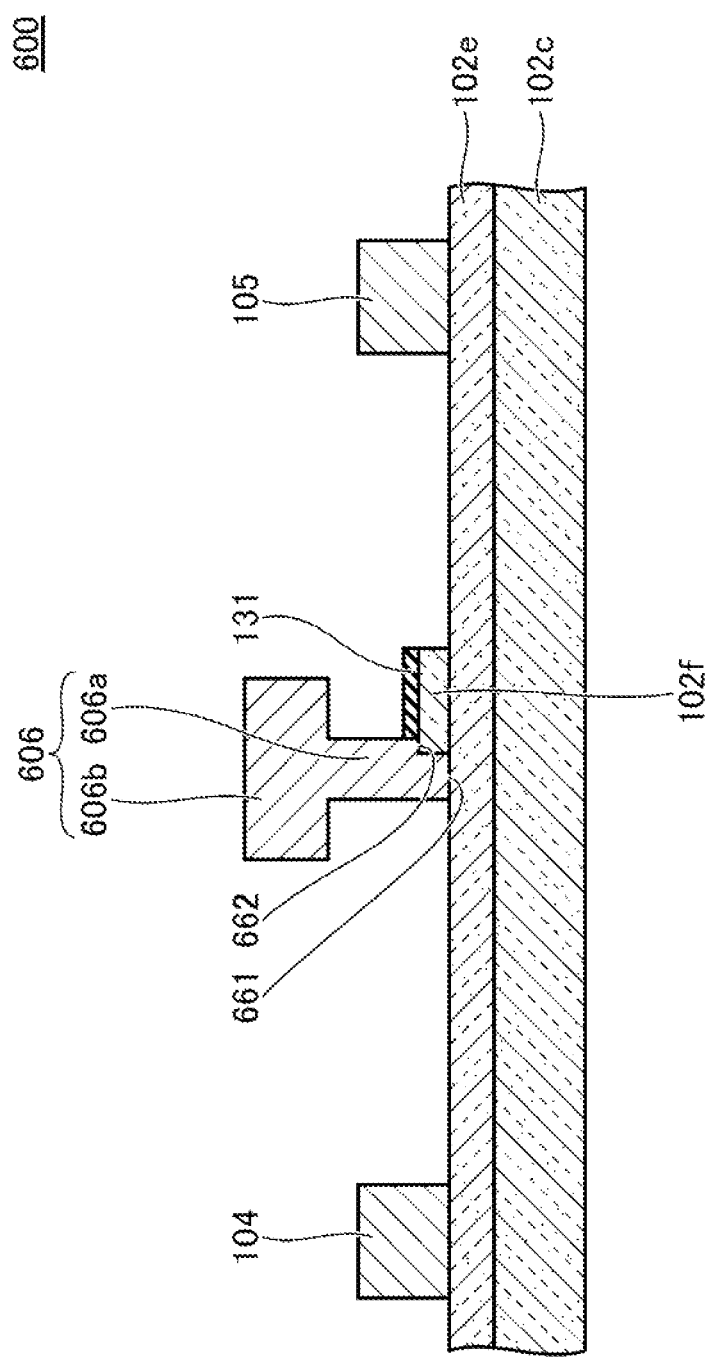
FIG. 18 is a cross-sectional view illustrating a semiconductor device according to a sixth embodiment.

A sixth embodiment will be described. The sixth embodiment differs from the first embodiment in terms of the structures of the capping layer and the gate electrode. FIG. 18 is a cross-sectional view illustrating a semiconductor device 600 according to a sixth embodiment.

The semiconductor device 600 according to a sixth embodiment includes an electron transit layer (channel layer) 102c and an electron supply layer (barrier layer) 102e that are stacked on each other, a capping layer 102f, a negative charge generation layer 131, a source electrode 104, a drain electrode 105, and a gate electrode 606, as illustrated in FIG. 18.

The source electrode 104, the drain electrode 105 and the gate electrode 606 are disposed on the electron supply layer 102e. The gate electrode 606 is disposed between the source electrode 104 and the drain electrode 105. For example, the gate electrode 606 has a base portion 606a and an umbrella portion 606b above the base portion 606a. The capping layer 102f disposed on the electron supply layer 102e between at least the gate electrode 606 and the drain electrode 105. The negative charge generation layer 131 is disposed on the capping layer 102f.

A bottom face of the gate electrode 606 includes a bottom face 661 and a bottom face 662 to form a step in a direction from a source electrode 104 side edge to a drain electrode 105 side edge. The bottom face 661 is lower than the bottom face 662. Thus, the drain electrode 105 side bottom face 662 is farther from the electron transit layer 102c than the source electrode 104 side bottom face 661. The capping layer 102f also disposed between the top face of the electron supply layer 102e and the bottom face 662 of the gate electrode 606. The bottom face 662 is in contact with the top face of the capping layer 102f. That is, the gate electrode 606 is formed so as to partially ride on the capping layer 102f. Thus, in a planar view, a source electrode 104 side edge of the capping layer 102f is closer to the source electrode 104 than a source electrode 104 side edge of the negative charge generation layer 131.

Other configurations are similar to those of the first embodiment.

According to the sixth embodiment, the same effect as the first embodiment may be obtained. Further, in the sixth embodiment, the gate electrode 606 is formed so as to partially ride on the capping layer 102f. Thus, the tunnel probability between the gate electrode 606 and the electron transit layer 102c may be significantly reduced, and a drain breakdown voltage may further be improved.

Hereinafter, a simulation according to the sixth embodiment will be described. FIGS. 19A to 21B are diagrams illustrating simulation results according to the sixth embodiment.

FIG. 19A illustrates a distribution of the electric field intensity according to the first embodiment, and FIG. 19B illustrates a distribution of the electric field intensity according to the sixth embodiment. In this simulation, the electric field intensity distribution is studied, assuming that a capping layer 102g having a thickness of 2 nm is disposed on the electron supply layer 102e, and a GaN layer having a thickness of 10 nm is disposed as the capping layer 102f on the capping layer 102g. Further, in the sixth embodiment (FIG. 19B), the gate electrode 606 is formed so as to partially ride on a 50 nm long portion of the capping layer 102f in the gate length direction.

As illustrated in FIG. 19A, according to the first embodiment, a region where the electric field is likely to be concentrated is a region near a drain electrode side end of the bottom face of the gate electrode 106, where the bottom face is in contact with the capping layer 102g. By contrast, as illustrated in FIG. 19B, according to the sixth embodiment, a region where the electric field is likely to be concentrated is a region away from a drain electrode side end of the bottom face of the gate electrode 606, where the bottom face is in contact with the capping layer 102g. Accordingly, according to the sixth embodiment, an even better drain breakdown voltage may be obtained.

Figure 20:
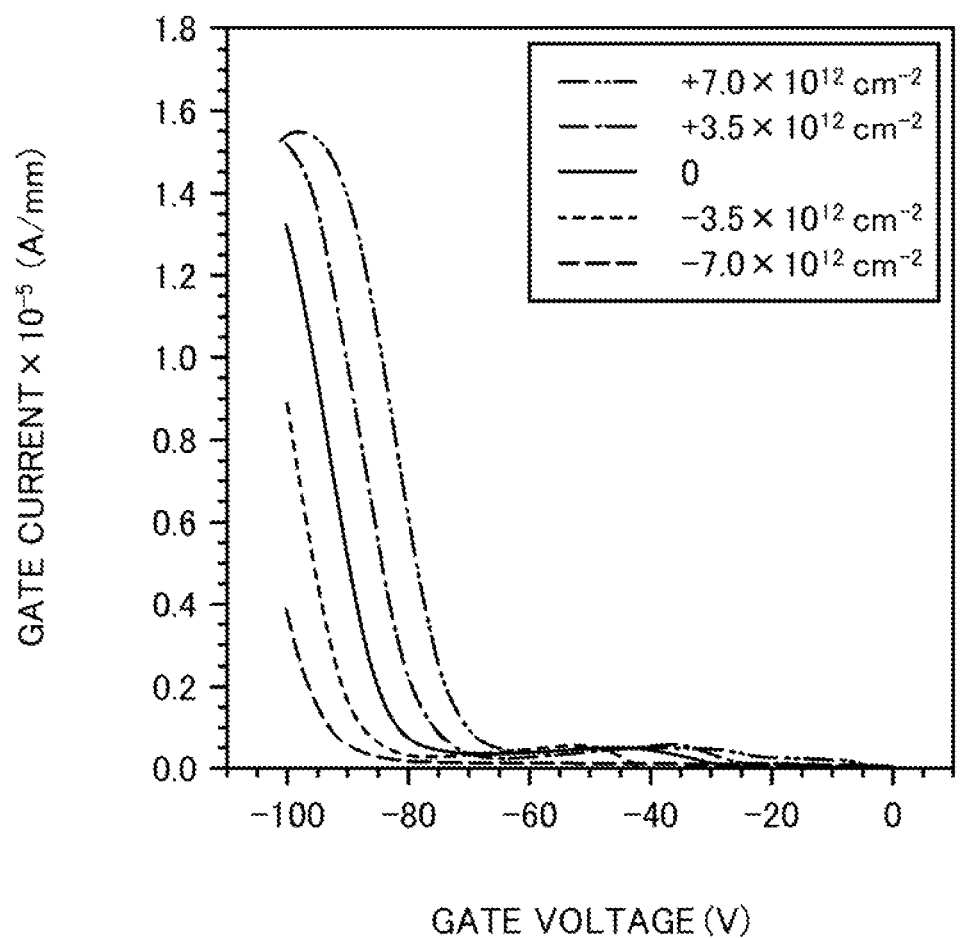
FIG. 20 is a graph (Part 2) illustrating results of simulation according to the sixth embodiment.

According to the simulation illustrating the results in FIG. 20, a relationship between the gate voltage and the gate current is studied, assuming that the capping layer 102f is a 10 nm thick GaN layer and the gate electrode 606 is disposed so as to partially ride on a 50 nm portion of the capping layer 102f in the gate length direction, and various types of charges are applied to the top face of the capping layer 102f instead of the negative charge generation layer 131. The charges applied to the top face of the capping layer 102f are similar to the simulation obtained according to the first embodiment (see FIGS. 4A to 4E and FIG. 5).

As may be seen from the comparison of FIGS. 5 and 20, according to the sixth embodiment, the gate current may be significantly reduced. This means that an even better drain breakdown voltage may be obtained.

Figure 21A:
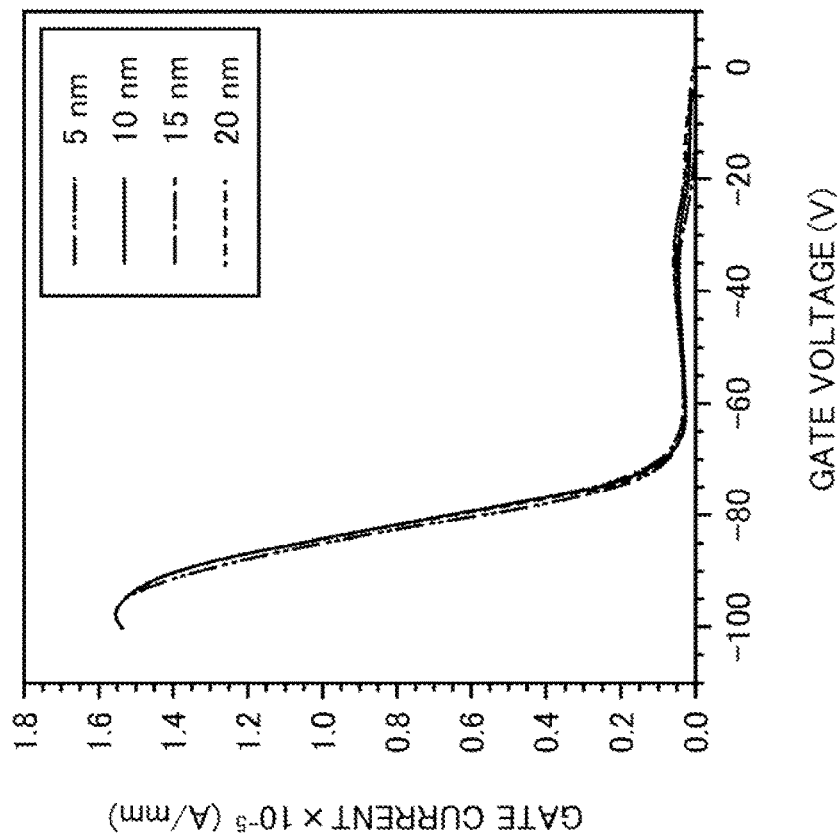
FIGS. 21A and 21B are graphs (Part 3) illustrating results of simulation according to the sixth embodiment.
Figure 21B:
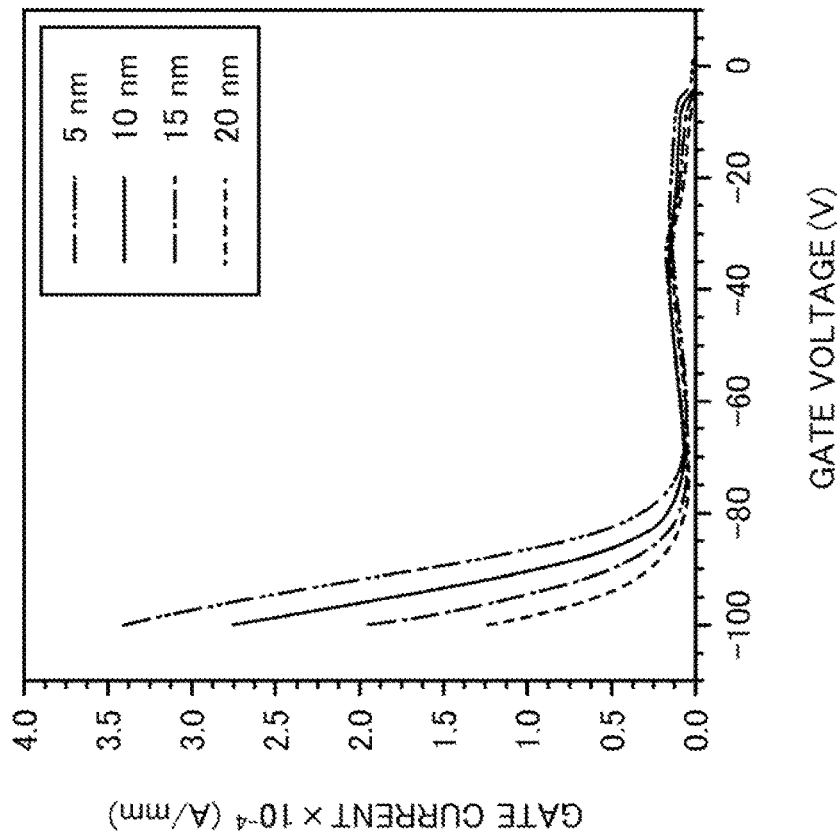

As illustrated in the simulation results in FIGS. 21A and 21B, in the first embodiment and the sixth embodiment, a relationship between the gate voltage and the gate current is studied by changing the thickness of the capping layer 102f when a positive charge (hole) is applied at a concentration of $7.0 \times 10^{12}$ cm$^{-2}$ to the top face of the capping layer 102f instead of the negative charge generation layer 131. The capping layer 102f is a GaN layer. In the sixth embodiment, the gate electrode 606 is formed so as to partially ride on a 50 nm portion of the capping layer 102f in the gate length direction. FIG. 21A illustrates simulation results according to the first embodiment, and FIG. 21B illustrates simulation results according to the sixth embodiment.

As illustrated in FIGS. 21A and 21B, the gate current may be greatly reduced by disposing the gate electrode 606 so as to partially ride on a portion of the capping layer 102f, provided that a positively charge is applied.

Seventh Embodiment

Figure 22:
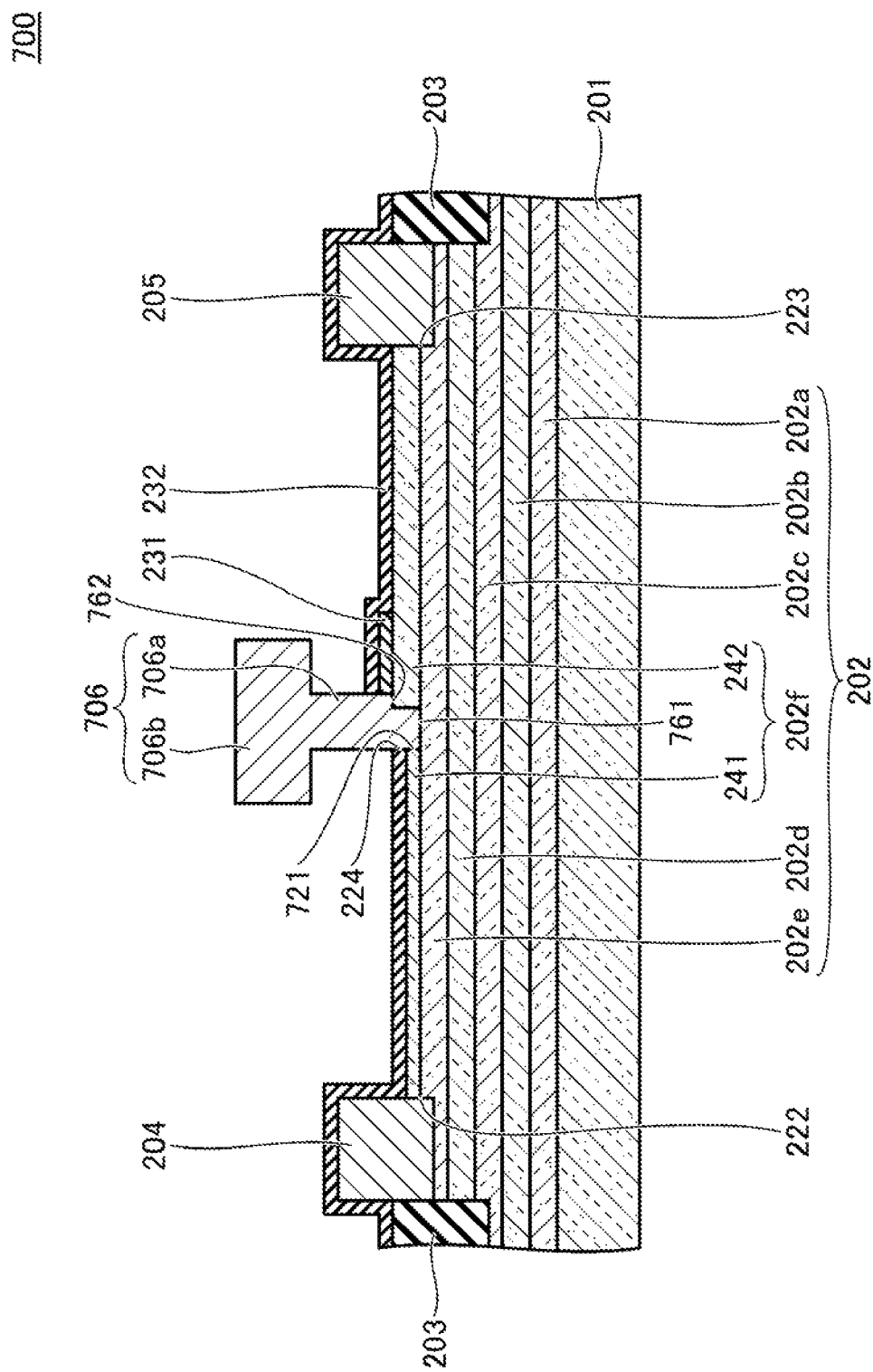
FIG. 22 is a cross-sectional view illustrating a semiconductor device according to a seventh embodiment.

A seventh embodiment will be described. The seventh embodiment differs from the second embodiment in terms of the structures of the capping layer and the gate electrode. FIG. 22 is a cross-sectional view illustrating a semiconductor device 700 according to a seventh embodiment.

In the semiconductor device 700 according to the seventh embodiment, a gate electrode 706 is disposed instead of the gate electrode 206, as illustrated in FIG. 22. Also, a recess 721 is formed instead of the recess 221. The recess 721 has a smaller dimension in the gate length direction than the recess 221. The gate electrode 706 has a base portion 706a and an umbrella portion 706b above the base portion 706a, such that a cross-sectional shape of the gate electrode 706 is substantially T-shaped, for example. The bottom face of the base portion 706a has a bottom face 761 and a bottom face 762 to form a step in a direction from the source electrode 204 toward the drain electrode 205. The bottom face 761 is lower than the bottom face 761. Thus, the bottom face 762 is farther from the electron transit layer 202c than the bottom face 761. The capping layer 202f is also disposed between the top face of the electron supply layer 202e and the bottom face 762 of the base portion 706a. The bottom face. 761 is in contact with the top face of the electron supply layer 202e inside the recess 721, and the bottom face 762 is in contact with the top face of the capping layer 2021. That is, the gate electrode 706 formed so as to partially ride on the capping layer 202f. Thus, in a planar view, a source electrode 204 side edge of the second portion 242 of the capping layer 202f is closer to the source electrode 204 than a source electrode 204 side edge of the negative charge generation layer 231. The dimension in the gate length direction of the base portion 706a above the bottom face 762 is greater than the dimension in the gate length direction of the recess 721. The dimension in the gate length direction of the base portion 706a above the bottom face 762 may be equivalent to the dimension in the gate length direction of the base portion 206a in the second embodiment. The umbrella portion 706b has a shape extending in the gate length direction from the base portion 706a toward the source electrode 204 and the drain electrode 205. Thus, the dimension in the gate length direction of the umbrella portion 706b is greater than the dimension in the gate length direction of the base portion 706a. The bottom face 762 of the gate electrode 706 and the top face of the capping layer 202f are preferably in contact with each other within a range of 50 nm or more in the gate length direction and 50% or less of the gate length.

Other configurations are similar to those of the second embodiment.

According to the seventh embodiment, the same effect as the second embodiment may be obtained.

Next, a method for fabricating the semiconductor device 700 according to the seventh embodiment will be described. FIGS. 23A to 23C and FIGS. 24A and 24B are cross-sectional views illustrating a method for fabricating the semiconductor device 700 according to the seventh embodiment.

Figure 23A:
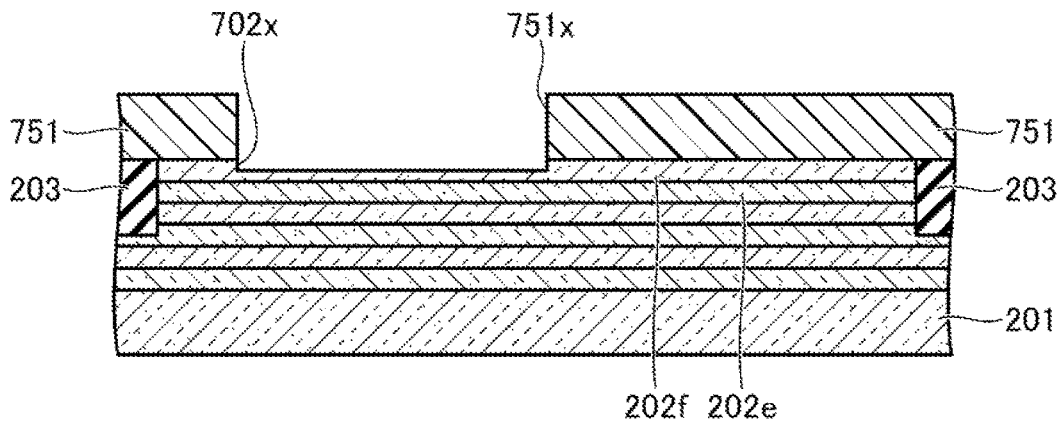
FIGS. 23A to 23C are cross-sectional views (Part 1) illustrating a method for fabricating a semiconductor device according to the seventh embodiment.

First, the process up to the formation of the device separation region 203 is performed in the same manner as in the second embodiment (see FIG. 7B). Then, as illustrated in FIG. 23A, a resist pattern 751 defining an opening 751x is formed on the semiconductor stacked structure 202 where the opening 751x corresponds to a region intended to form the recess 721, and a region between the region intended to form the recess 721 and a region intended to form the recess 222. Thereafter, the capping layer 202f is dry etched using the resist pattern 751 as a mask to form a recess 702x following the opening 751x in the capping layer 202f. In dry etching of the capping layer 202f, for example, an inert gas and a chlorine-based gas such as a Cl$_2$ gas are used as etching gases. The remaining thickness of the capping layer 202f is, for example, 2 nm to 3 nm.

Figure 23B:
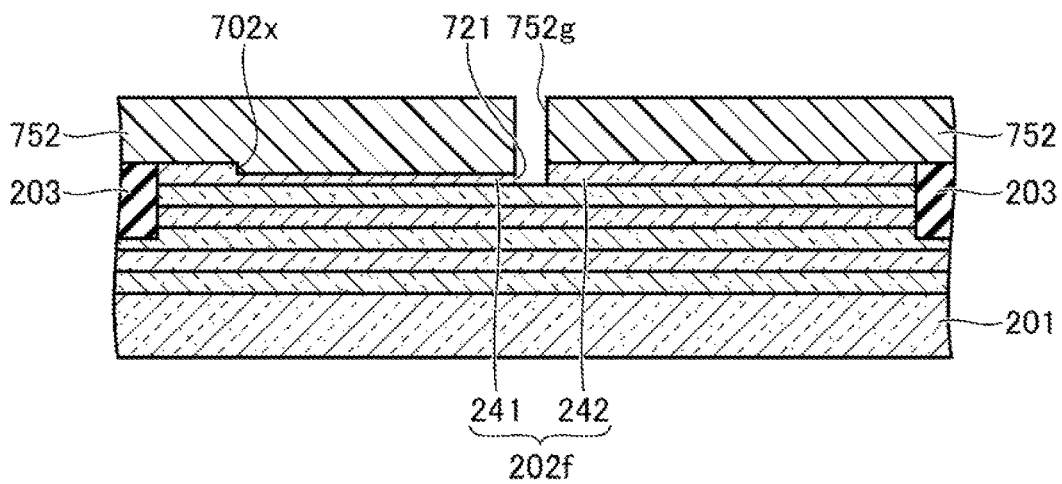

The resist pattern 751 is then removed using a heated organic solvent, as illustrated in FIG. 23B. A resist pattern 752 defining an opening 752g is then formed on the semiconductor stacked structure 202, where the opening 752g corresponds to a region intended to form a recess 721. The dimension in the gate length direction of the opening 752g is smaller than the dimension in the gate length direction of the opening 252g in the second embodiment. Subsequently, the capping layer 202f is dry etched using the resist pattern 752 as a mask to form the recess 721 following the opening 752g in the capping layer 202f. The recess 721 is connected to the recess 702x. In dry etching of the capping layer 202f, for example, an inert gas and a chlorine-based gas such as a Cl$_2$ gas are used as etching gases.

Figure 23C:
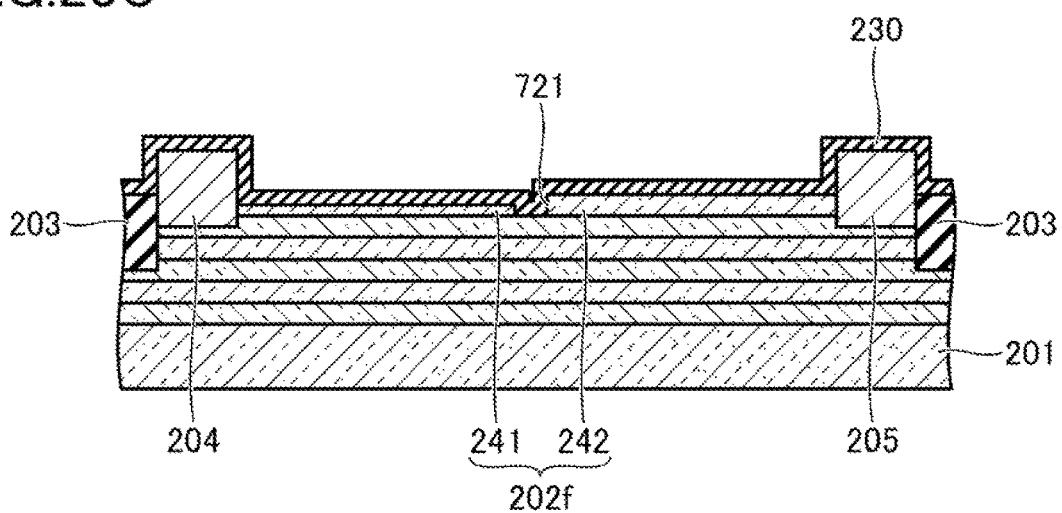

The resist pattern 752 is then removed using a heated organic solvent, as illustrated in FIG. 23C. Thereafter, as in the second embodiment, the process from the formation of the resist pattern 253 to the formation of the layer 230 is performed.

Figure 24A:
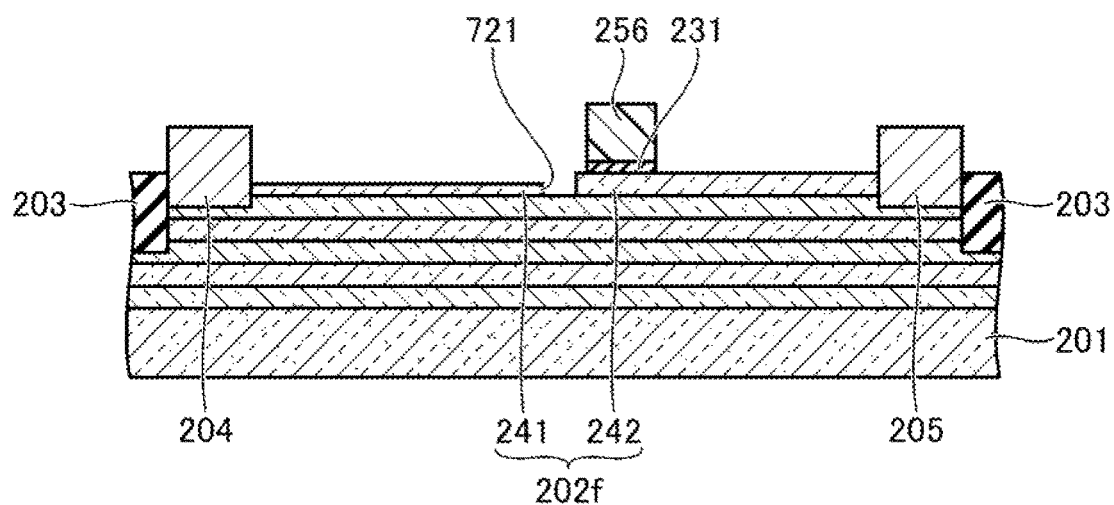
FIGS. 24A and 24B are cross-sectional views (Part 2) illustrating a method for fabricating a semiconductor device according to the seventh embodiment.

Subsequently, as illustrated in FIG. 24A, a resist pattern 256 covering a region intended to form the negative charge generation layer 231 is formed on the layer 230. The resist pattern 256 is then used as a mask to dry etch the layer 230 to remove a portion exposed from the resist pattern 256. As a result, the negative charge generation layer 231 is selectively formed on the capping layer 2021. The negative charge generation layer 231 is formed such that a source electrode 204 side edge of the second portion 242 is closer to the source electrode 204 than a source electrode 204 side edge of the negative charge generation layer 231.

Figure 24B:
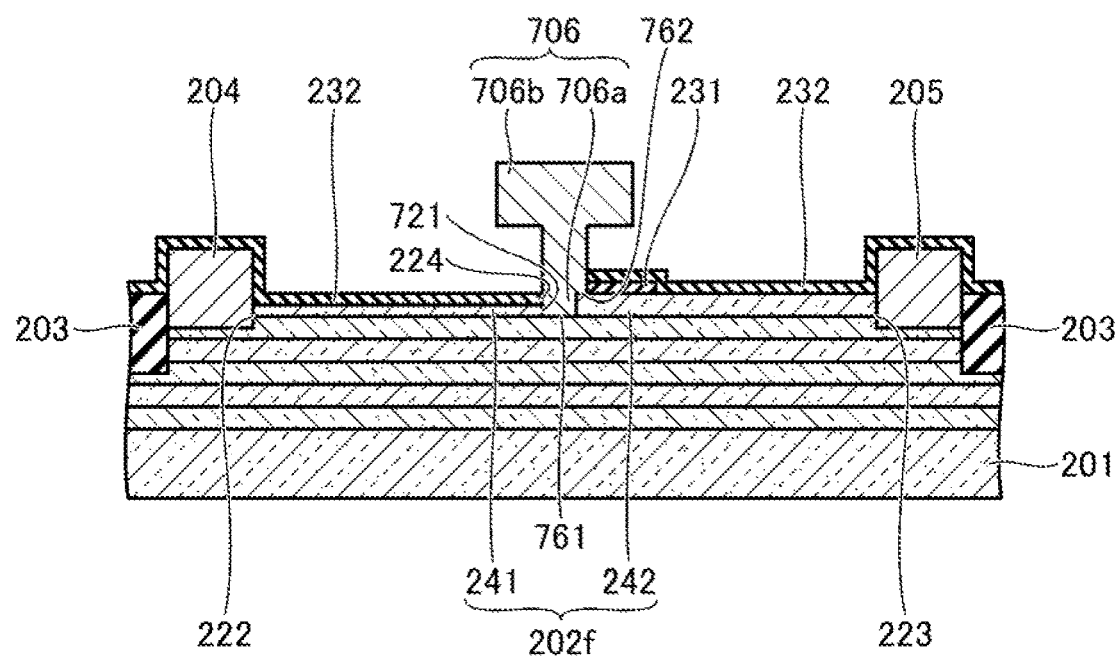

Thereafter, as illustrated in FIG. 24B, the resist pattern 256 is removed and a subsequent process is performed as in the second embodiment to complete the semiconductor device 700.

Figure 25A:
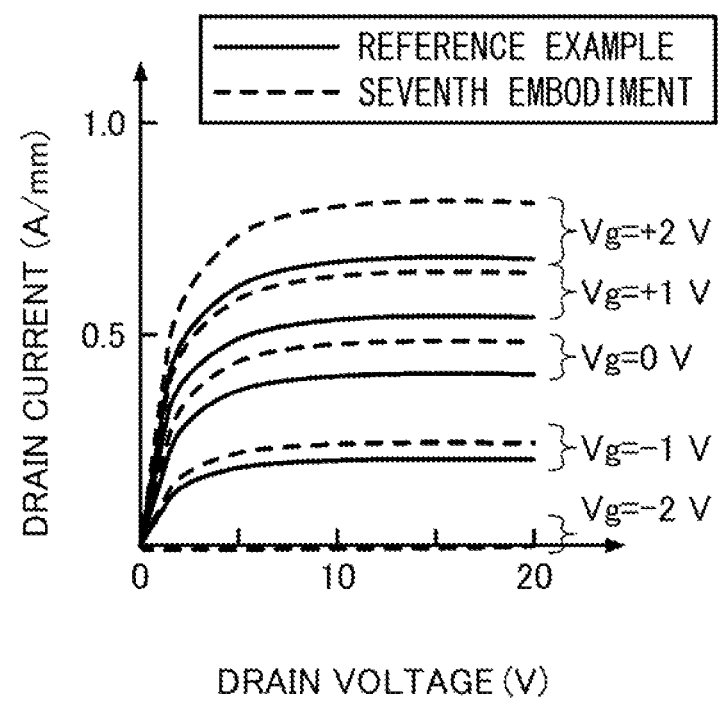
FIGS. 25A and 25B are graphs each illustrating a relationship between a drain voltage and a drain current of a semiconductor device fabricated according to simulation of the seventh embodiment.
Figure 25B:
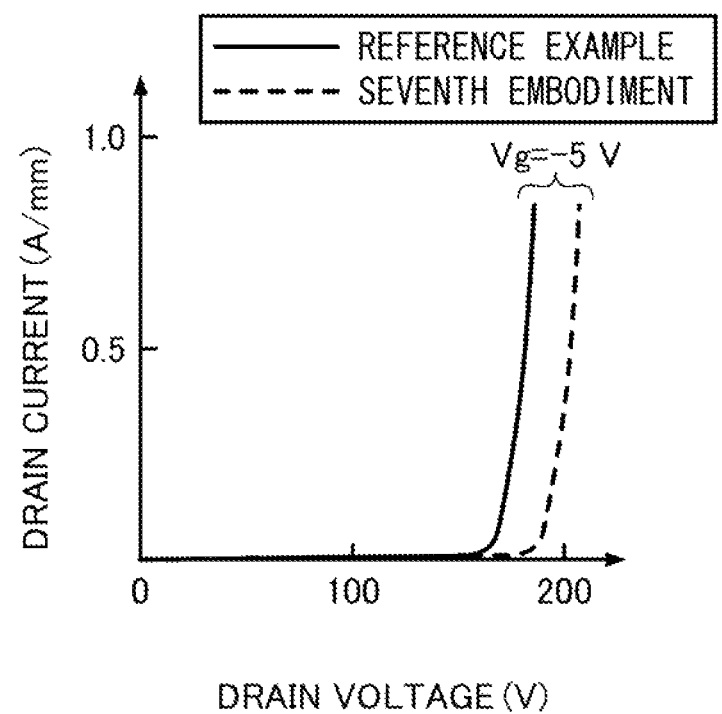

FIGS. 25A and 25B are graphs illustrating characteristics of three terminals in the semiconductor device 700 fabricated according to the seventh embodiment. FIG. 25A illustrates a relationship between the drain voltage and the drain current when the drain voltage is 0 V to 20 V, and the gate voltage Vg is −2V, −1V, +1V, and +2V. FIG. 25B illustrates the relationship between the drain voltage and the drain current when the drain voltage is 0 V to 200 V, and the gate voltage Vg is −5V. FIGS. 25A and 25B also illustrate characteristics of three-terminals according to the reference example having a structure obtained by removing the negative charge generation layer 231 from the seventh embodiment.

As illustrated in FIGS. 25A and 25B, the semiconductor device fabricated according to the seventh embodiment may reduce the on-resistance, may increase the drain current, and may improve the drain breakdown voltage. This enables an amplifier, to which the semiconductor device is applied, to achieve high output power and high efficiency.

Eighth Embodiment

Figure 26:
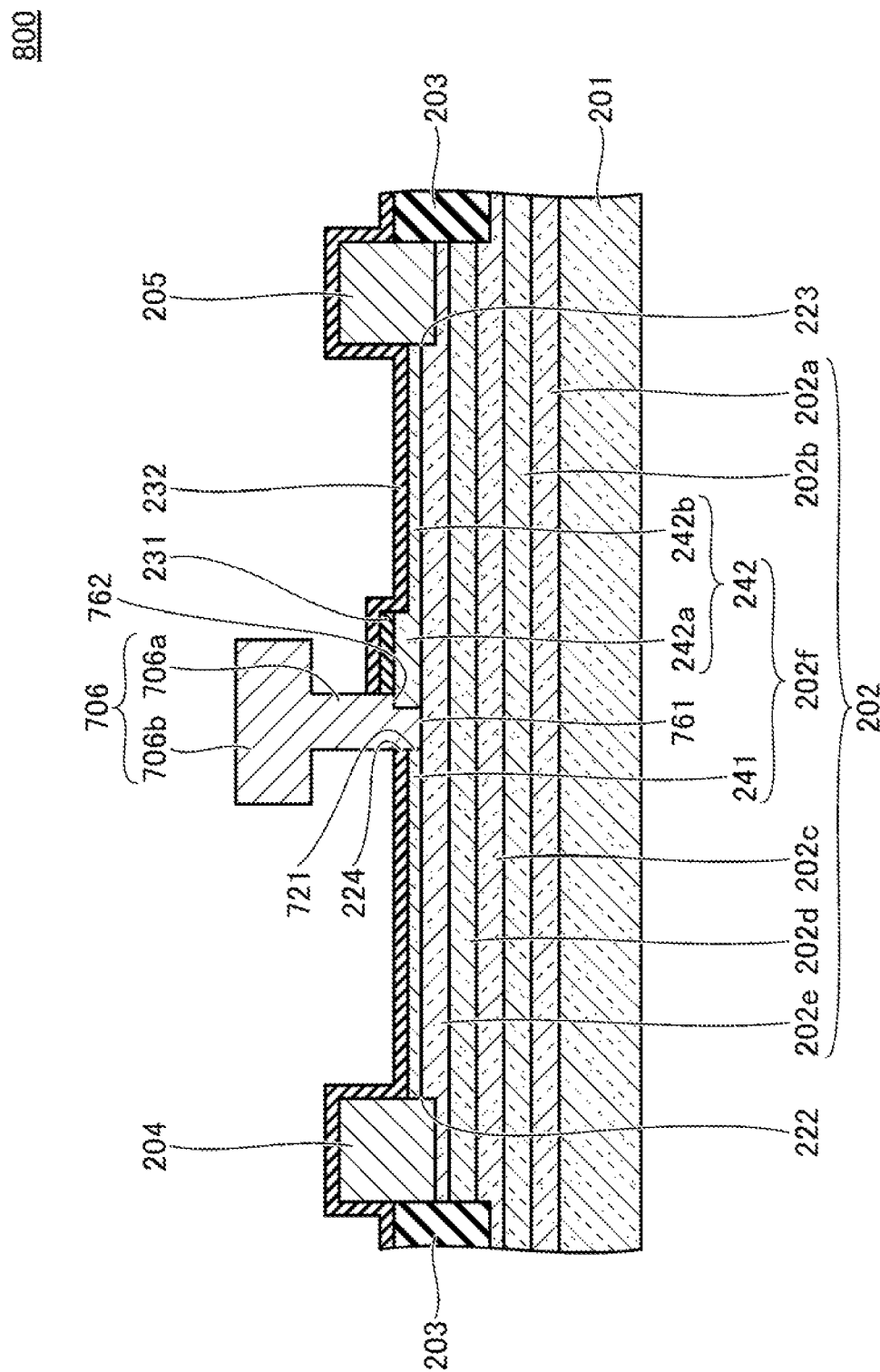
FIG. 26 is a cross-sectional view illustrating a semiconductor device according to an eighth embodiment.

An eighth embodiment will be described. The eighth embodiment differs from the seventh embodiment in terms of the structure of the second portion 242 of the capping layer 102f. FIG. 26 is a cross-sectional view illustrating a semiconductor device 800 according to an eighth embodiment.

As illustrated in FIG. 26, in the semiconductor device 800 according to the eighth embodiment, the second portion 242 includes a third portion 242a overlapping the negative charge generation layer 231 in a plan view, and a fourth portion 242b disposed between the third portion 242a and the drain electrode 205. The bottom face 762 of the base portion 706a is in contact with the top face of the third portion 242a. The third portion 242a is thicker than the first portion 241. The thickness of the fourth portion 242b is equivalent to the thickness of the first portion 241. For example, the thicknesses of the first portion 241 and the fourth portion 242b may be 2 nm to 3 nm, and the thicknesses of the third portion 242a are 5 nm or more, preferably 10 nm or more.

Other configurations are similar to those of the seventh embodiment.

The eighth embodiment may obtain the same effect as the seventh embodiment.

In comparing the seventh embodiment and the eighth embodiment, for example, the seventh embodiment is preferable in view of the drain breakdown voltage.

The semiconductor device 800 according to the eighth embodiment may be fabricated, for example, by combining a method for fabricating the semiconductor device 700 with a method for fabricating the capping layer 202f in a method for fabricating the semiconductor device 300.

Ninth Embodiment

Figure 27:
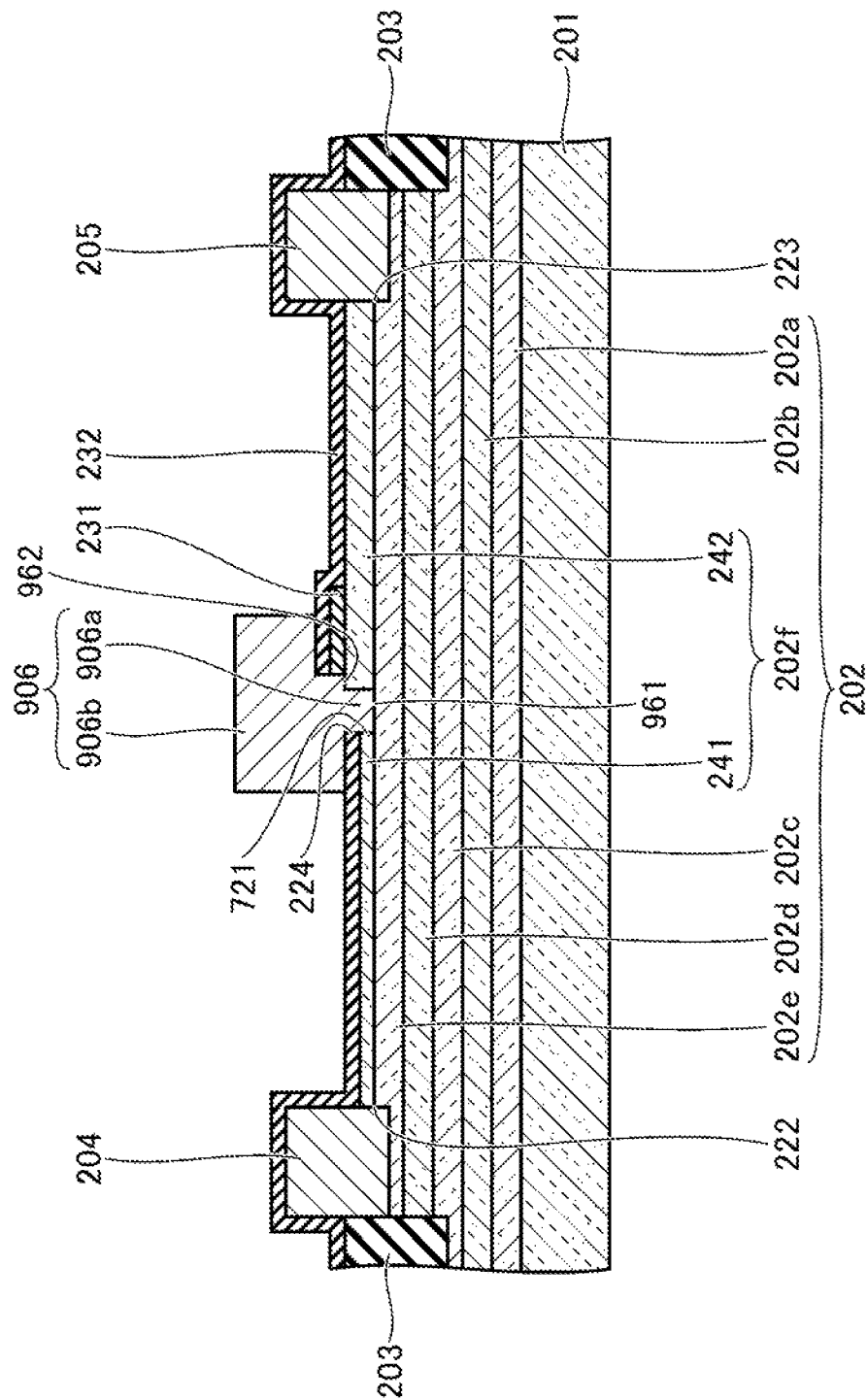
FIG. 27 is a cross-sectional view illustrating a semiconductor device according to a ninth embodiment.

A ninth embodiment will be described. The ninth embodiment differs from the seventh embodiment in terms of the structure of the gate electrode. FIG. 27 is a cross-sectional view illustrating a semiconductor device 900 according to a ninth embodiment.

In the semiconductor device 900 according to the ninth embodiment, a gate electrode 906 is disposed instead of the gate electrode 706, as illustrated in FIG. 27. The gate electrode 906 has a base portion 906a and an umbrella portion 906b above the base portion 906a. A bottom face of the umbrella portion 906b is in contact with the top face of the insulating layer 232. The bottom face of the base portion 906a has a bottom face 961 and a bottom face 962, which forms a step in a direction from the source electrode 204 toward the drain electrode 205. As a result, the bottom face 962 is farther from the electron transit layer 202c than the bottom face 961. The step formed on the bottom face of the base portion 906a may be part of the bottom face of umbrella portion 906b. The capping layer 202f is also disposed between the top face of the electron supply layer 202e and the bottom face 962 of the base portion 906a. The bottom face 961 is in contact with the top face of electron supply layer 202e within the recess 721, and the bottom face 962 is in contact with the top face of the capping layer 2021. That is, the gate electrode 906 is formed so as to partially ride on the capping layer 202f. Accordingly, in a plan view, a source electrode 201 side end of the second portion 242 of the capping layer 202f is closer to the source electrode 204 than a source electrode 204 side end of the negative charge generation layer 231. The umbrella portion 906b has a shape extending from the base portion 906a toward both the source electrode 204 and the drain electrode 205 in the gate length direction. Thus, the dimension of the umbrella portion 906b in the gate length direction is greater than the dimension of the base portion 906a in the gate length direction. The bottom face 962 of the gate electrode 906 and the top face of the capping layer 202f are preferably in contact with each other, within a range of 50 nm or more in the gate length direction and 50% or less of a gate length.

Other configurations are similar to those of the seventh embodiment.

The semiconductor device 900 according to the ninth embodiment may be fabricated, for example, by combining a method for fabricating the semiconductor device 700 with a method of forming the gate electrode 406 in the method for fabricating the semiconductor device 400.

Tenth Embodiment

Figure 28:
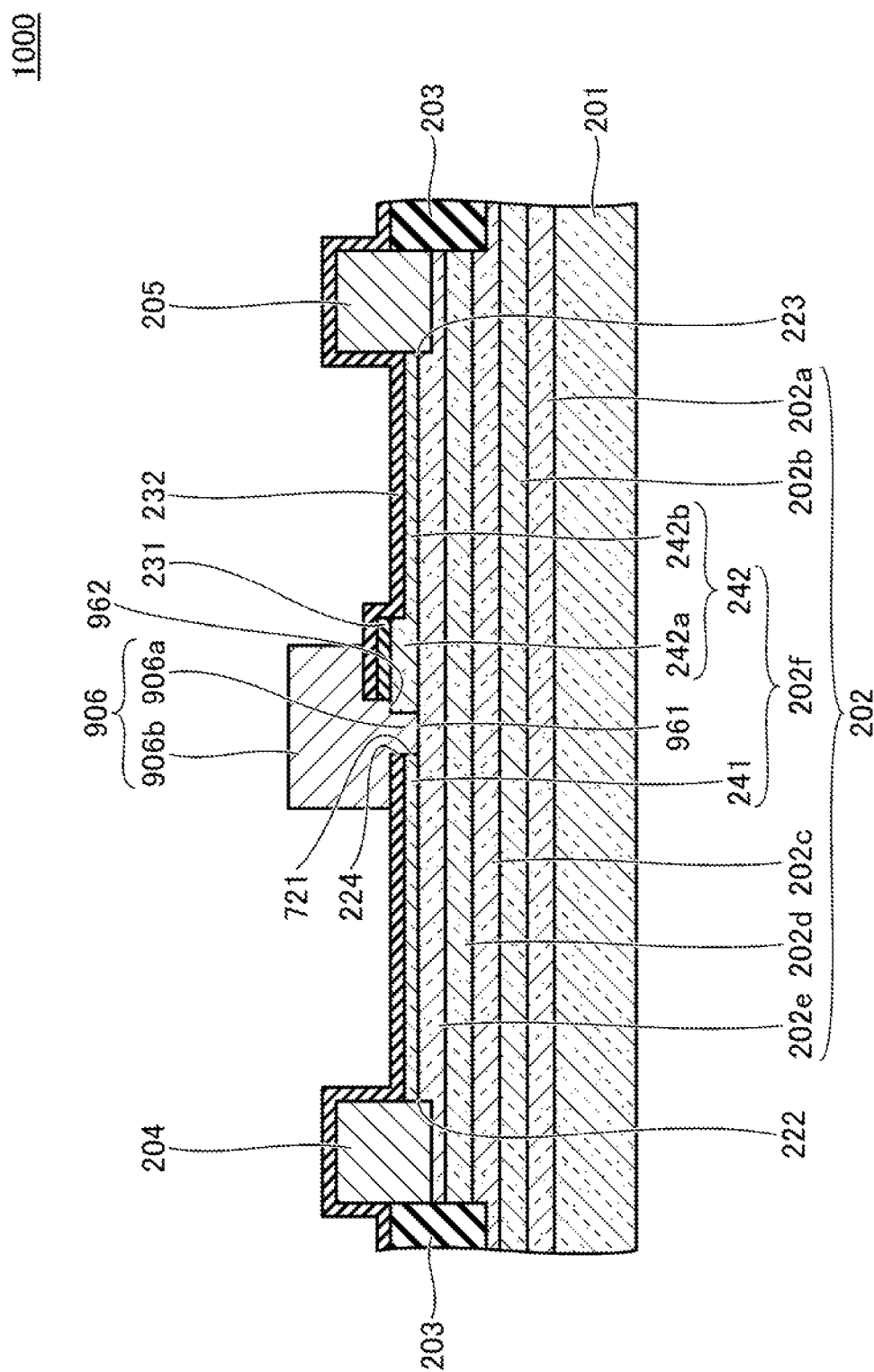
FIG. 28 is a cross-sectional view illustrating a semiconductor device according to a tenth embodiment.

A tenth embodiment will be described. The tenth embodiment differs from the ninth embodiment in terms of the structure of the second portion 242 of the capping layer 202f. FIG. 28 is a cross-sectional view illustrating a semiconductor device 1000 according to a tenth embodiment.

As illustrated in FIG. 28, in the semiconductor device 1000 according to the tenth embodiment, the second portion 242 includes, as in the eighth embodiment, a third portion 242a overlapping the negative charge generation layer 231 in a plan view, and a fourth portion 242b disposed between the third portion 242a and the drain electrode 205. The third portion 242a is thicker than the first portion 241. The thickness of the fourth portion 242b is equivalent to the thickness of the first portion 241. For example, the thicknesses of the first portion 241 and the fourth portion 242b are 2 nm to 3 nm. The thickness of the third portion 242a is 5 nm or more, and is preferably 10 nm or more.

Other configurations are similar to those of the ninth embodiment.

The tenth embodiment may obtain the same effect as the ninth embodiment.

Preferably, a thickness of the capping layer 202f is 6 nm or more in a portion between the base portion 906a of the gate electrode 906 and the drain electrode 205, and also beneath the umbrella portion 906b of the gate electrode 906. The thicker the capping layer 202f, the lower the concentration of 2DEG and the better the drain breakdown voltage when the thickness of this portion of the capping layer 202f is 6 nm or more. More preferably, the thickness of this portion of the capping layer 202f is 10 nm or more.

Preferably, the thickness of the capping layer 202f between the gate electrode 906 and the source electrode 204 is 2 nm or more. The mobility is measured by varying the thickness of the capping layer 202f of GaN between the gate electrode 906 and the source electrode 204. Table 1 below illustrates measured results. The relative mobility in Table 1 is the relative mobility normalized to the mobility of 1.00 when the thickness of the capping layer 202f is 10 nm.

TABLE 1

| THICKNESS OF CAPPING LAYER (nm) | RELATIVE MOBILITY |
|---|---|
| 3 | 1.00 |
| 2 | 0.95 |
| 1 | 0.83 |
| 0 | 0.53 |

As illustrated in Table 1, within a thickness range between 0 nm and 3 nm, the thicker the capping layer 202f between the gate electrode 906 and the source electrode 204, the higher the relative mobility is obtained. Note that the thicker the capping layer 202f between the gate electrode 906 and the source electrode 204, the higher the sheet resistance. Accordingly, the thickness of the capping layer 202f between the gate electrode 906 and the source electrode 204 is preferably 2 nm or more, within the range of obtaining a desired sheet resistance.

Eleventh Embodiment

Figure 29:
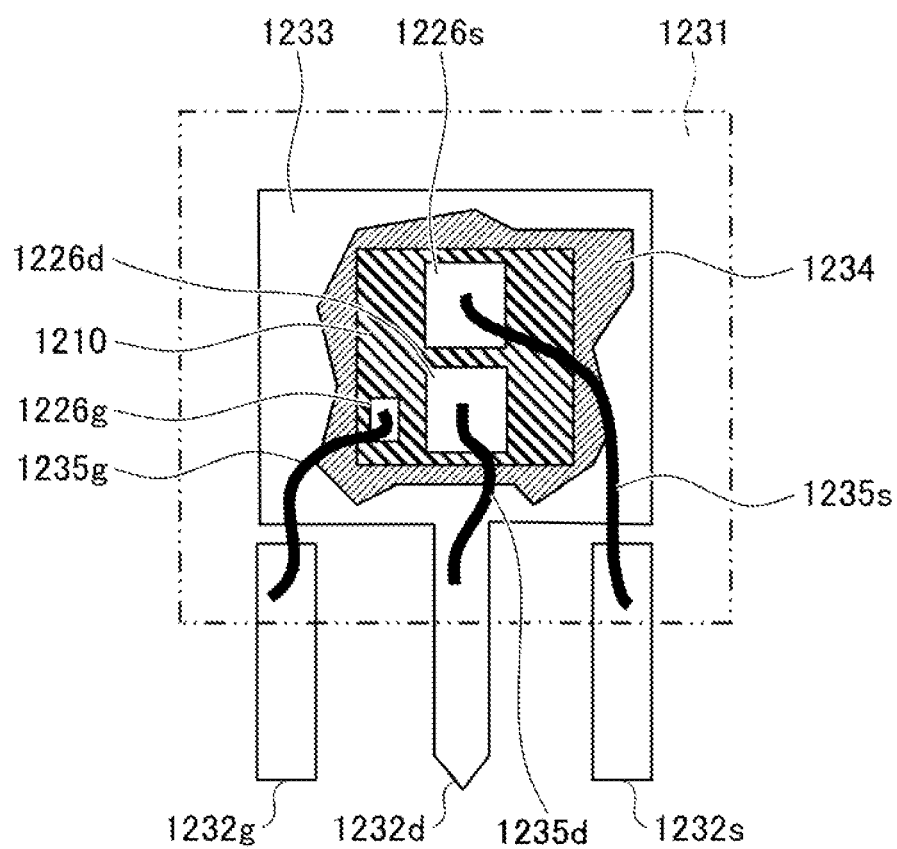
FIG. 29 is a view illustrating a discrete package according to an eleventh embodiment.

Next, an eleventh embodiment will be described. The eleventh embodiment relates to a discrete package of HEMT. FIG. 29 is a diagram illustrating a discrete package according to an eleventh embodiment.

As illustrated in FIG. 29, according to the eleventh embodiment, a back side of a semiconductor device 1210 having the same structure as any one of the first to tenth embodiments is secured to a land (die pad) 1233 with a die attach agent 1234, such as solder. One end of a wire 1235d, such as an Al wire, is connected to a drain pad 1226d to which the drain electrode 105 or 205 (not illustrated) is connected, and the other end of the wire 1235d is connected to drain lead. 1232d integral with the land 1233. One end of a wire 1235s, such as Al wire, is connected to a source pad 1226s connected to the source electrode 104 or 204 (not illustrated), and the other end of the wire 1235s is connected to a source lead 1232s independent of the land 1233. One end of a wire 1235g, such as Al wire, is connected to a gate pad 1226g connected to the gate electrode 106, 206, 406, 606, 706 or 906 (not illustrated), and the other end of the wire 1235g is connected to a gate lead 1232g independent of the land 1233. The land 1233 and the semiconductor device 1210 are then packaged with a mold resin 1231 so as to allow a portion of the gate lead 1232g, a portion of the drain lead 1232d, and a portion of the source lead 1232s to protrude from the package.

Such a discrete package may be fabricated as follows. First, the semiconductor device 1210 is secured to the land 1233 of a lead frame using a die attach agent 1234, such as solder. Subsequently, the gate pad 1226g is connected to the gate lead 1232q of the lead frame, the drain pad 1226d is connected to the drain lead 1232d of the lead frame, and the source pad 1226s is connected to the source lead 1232s of the lead frame, using bonding wires 1235g, 1235d, and 1235s. Thereafter, sealing is performed by the transfer mold process using a mold resin 1231 for. The lead frame is then disconnected.

Twelfth Embodiment

Figure 30:
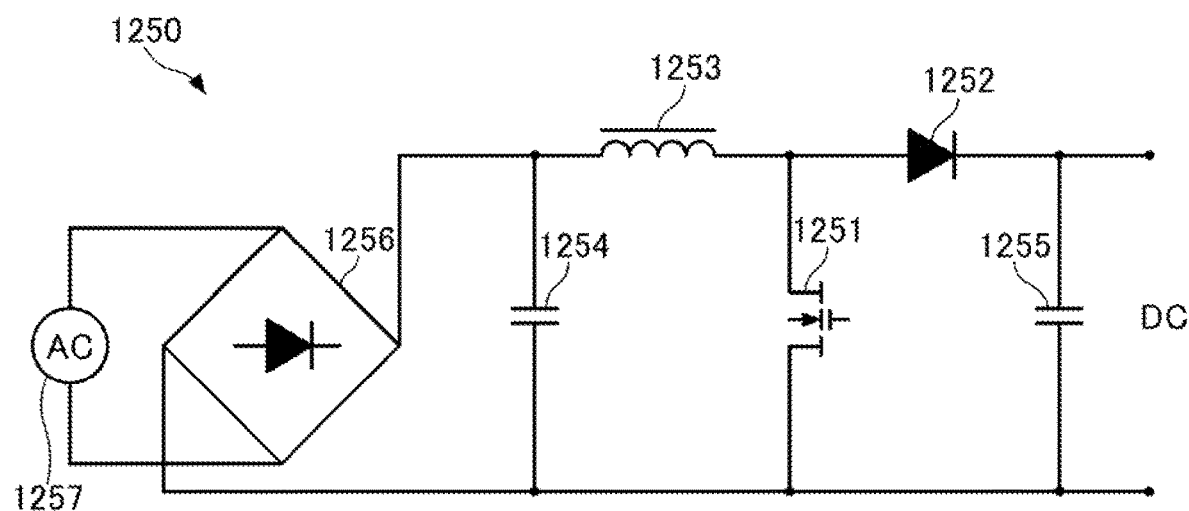
FIG. 30 is a line diagram illustrating a PFC circuit according to a twelfth embodiment.

Next, a twelfth embodiment will be described. The twelfth embodiment relates to a PFC (Power Factor Correction) circuit with a HEMT. FIG. 30 is a line diagram illustrating a PEC circuit 1250 according to the twelfth embodiment.

The PEC circuit 1250 is provided with a switch element (transistor) 1251, a diode 1252, a choke coil 1253, capacitors 1254 and 1255, a diode bridge 1256, and an AC power supply (AC) 1257. A drain electrode of the switch element 1251 is connected to an anode terminal of the diode 1252 and also to one terminal of the choke coil 1253. A source electrode of the switch element 1251 is connected to one terminal of the capacitor 1254 and also to one terminal of the capacitor 1255. The other terminal of the capacitor 1254 is connected to the other terminal of the choke coil 1253. The other terminal of the capacitor 1255 is connected to a cathode terminal of the diode 1252. A gate driver is connected to the gate electrode of the switch element 1251. The AC 1257 is connected between the two terminals of the capacitor 1254 via the diode bridge 1256. A DC power supply (DC) is connected between the two terminals of the capacitor 1255. According to the twelfth embodiment, the switch element 1251 is provided with a semiconductor device having the same structure as any one of the first to tenth embodiments.

According to the fabrication of the PFC circuit 1250, for example, solder or the like is used to connect the switch element 1251 to the diode 1252, the choke coil 1253, and the like.

Thirteenth Embodiment

Figure 31:
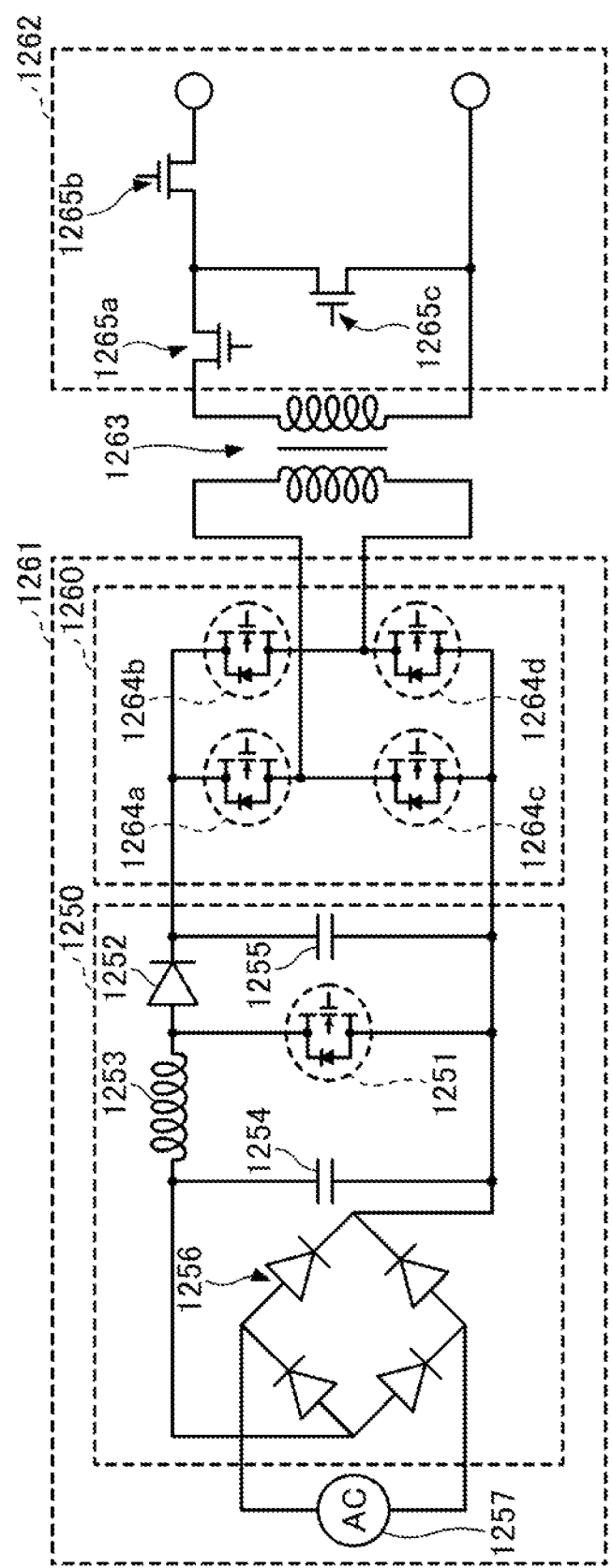
FIG. 31 is a line diagram illustrating a power supply device according to a thirteenth embodiment.

Next, a thirteenth embodiment will be described. The thirteenth embodiment relates to a power supply device with a HEMT. Such a power supply device with a HEMT is suitable for server power supply. FIG. 31 is a line diagram illustrating a power supply device according to the thirteenth embodiment.

The power supply device is provided with a high voltage primary circuit 1261 and a low voltage secondary circuit 1262. The power supply device is also provided with a transformer 1263 disposed between the primary circuit 1261 and the secondary circuit 1262.

The primary circuit 1261 is provided with the PFC circuit 1250 according to the twelfth embodiment and an inverter circuit such as a full bridge inverter circuit 1260. The inverter circuit is connected between two terminals of the capacitor 1255 of the PFC circuit 1250. The full bridge inverter circuit 1260 is provided with a plurality (in this example, four) of switch elements 1264a, 1264b, 1264c and 1264d.

The secondary circuit 1262 is provided with a plurality (three in this example) of switch elements 1265a, 1265b, and 1265c.

According to the thirteenth embodiment, the semiconductor devices having a structure similar to any one of the first to tenth embodiments are used for the switch element 1251 of the PFC circuit 1250, and the switch elements 1264a, 1264b, 1264c, and 1264d of the full bridge inverter circuit 1260 note that the switch element 1251 of the PFC circuit 1250, and the switch elements 1264a, 1264b, 1264c, and 1264d of the full bridge inverter circuit 1260 constitute the primary circuit 1261. By contrast, typical MIS-type FETs (field effect transistors) using silicon are used for the switch elements 1265a, 1265b and 1265c of the secondary circuit 1262.

Fourteenth Embodiment

Figure 32:
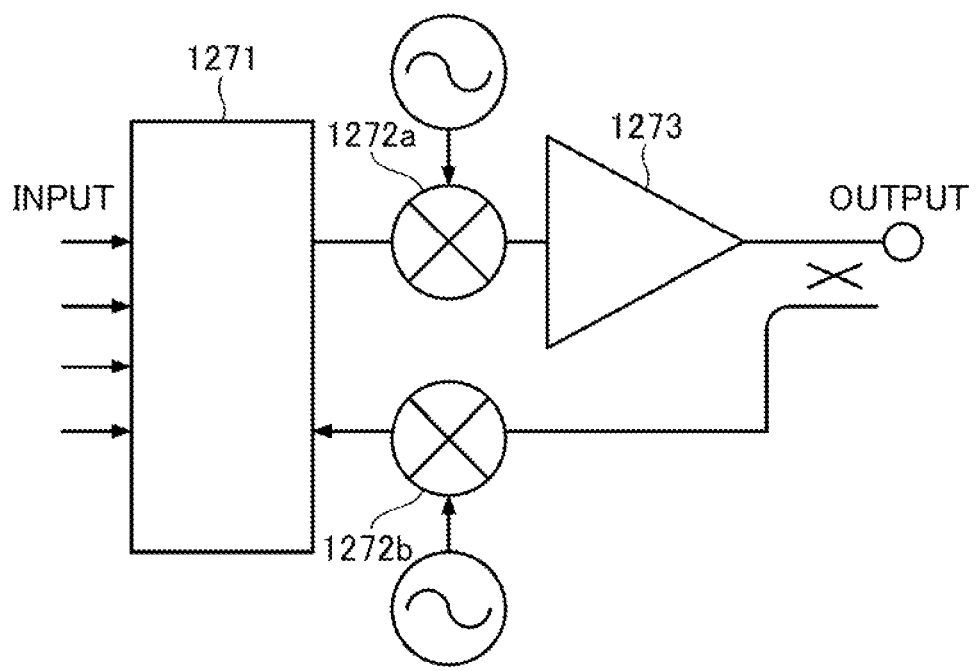
FIG. 32 is a line diagram illustrating an amplifier according to a fourteenth embodiment.

Next, a fourteenth embodiment will be described. The fourteenth embodiment relates to an amplifier with a HEMT. FIG. 32 is a line diagram illustrating an amplifier according to the fourteenth embodiment.

The amplifier is provided with a digital predistortion circuit 1271, mixers 1272a and 1272b, and a power amplifier 1273.

The digital predistortion circuit 1271 compensates for nonlinear distortion of an input signal. The mixer 1272a mixes the non-linear distortion compensated input signal and alternating current (AC) signal. The power amplifier 1273 includes a semiconductor device having a similar structure to any of the first to tenth embodiments to amplify the input signal that is mixed with the AC signal. According to the fourteenth embodiment, for example, an output signal may be switched to be mixed with the AC signal by the mixer 1272b, and a resulting signal may be transmitted to the digital predistortion circuit 1271. The amplifier may be used as a high-frequency amplifier, or a high-power amplifier. The high frequency amplifier may be used, for example, in transmitting and receiving devices for cellular base stations, radar devices, and microwave generators.

According to the present disclosure, the compositions of semiconductor layers are not limited to those described in the above embodiments. For example, nitride semiconductor layers such as InAlN, InGaAlN, and the like may be used.

Effects of the Invention

According to the present disclosure, a drain breakdown voltage may be improved.

Preferred embodiments have been described in detail above. However, various changes and substitutions may be added to the embodiments described above, without limiting by the embodiments described above and without departing from the scope described in the claim.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present, inventions have been described in detail, it should be understood that the various changes, substitutions, and alterations could be made hereto without departing from the spirit and scope of the invention.

What is claimed is:

1. A semiconductor device comprising:
an electron transit layer;
an electron supply layer disposed above the electron transit layer;
a source electrode, a drain electrode, and a gate electrode, the source electrode, the drain electrode, and the gate electrode being disposed on the electron supply layer;
a first capping layer disposed on the electron supply layer between the gate electrode and the drain electrode; and
a negative charge generation layer disposed on the first capping layer, the negative charge generation layer being configured to generate a negative charge,
wherein the gate electrode includes a base portion and an umbrella portion above the base portion, the umbrella portion having an extending portion extending at least more toward the drain electrode than the base portion,
wherein the negative charge generation layer is disposed between an end of the extending portion of the umbrella portion and the electron supply layer,
wherein the base portion has a first bottom face and a second bottom face, the first bottom face being in direct contact with a top face of the electron supply layer, and the second bottom face being in direct contact with a top face of the first capping layer, and
wherein the first capping layer includes a first portion and a second portion, the first portion overlapping the negative charge generation layer in plan view, and the first portion being thicker than the second portion.

2. The semiconductor device as claimed in claim 1, wherein the second bottom face of the gate electrode contacts the top face of the first capping layer between the base portion and the drain electrode.

3. The semiconductor device as claimed in claim 2, wherein the second bottom face of the gate electrode and the top face of the first capping layer are in contact with each other, within a range of 50 nm or more in a direction of a gate length and 50% or less of the gate length.

4. The semiconductor device as claimed in claim 1, wherein a thickness of a portion of the first capping layer is 6 nm or more, the portion being disposed between the end of the extending portion of the umbrella portion and the electron supply layer.

5. The semiconductor device as claimed in claim 1, further comprising:
a second capping layer disposed on the electron supply layer between the gate electrode and the source electrode,
wherein the second capping layer is thinner than the first capping layer.

6. The semiconductor device as claimed in claim 5, wherein a thickness of the second capping layer is 2 nm or more.

7. The semiconductor device as claimed in claim 1, wherein the negative charge generation layer contains more electrons than holes such that the negative charge generation layer is negatively charged.

8. The semiconductor device as claimed in claim 1, wherein the negative charge generation layer includes a composition having an excess of anionic elements or elements with high electronegativity relative to a stoichiometric composition thereof.

9. The semiconductor device as claimed in claim 1, wherein the negative charge generation layer includes elements that become m types (m is a natural number) of cations and elements that become n types (n is a natural number) of anions, and
wherein $\Sigma am \times Xm - \Sigma bn \times Yn$ is negative when a composition of the negative charge generation layer is represented by $Am_{xm} \ldots Bn_{Yn} \ldots$, a cationic valence of an element Am is represented by am, and an anionic valence of an element Bn is represented by bn.

10. The semiconductor device as claimed in claim 1, wherein the negative charge generation layer includes silicon and nitrogen, and wherein when a composition of the negative charge generation layer is represented by $Si_XN_Y$, a value of X/Y is less than ¾.

11. The semiconductor device as claimed in claim 1,
wherein the negative charge generation layer includes aluminum and oxygen, and
wherein when a composition of the negative charge generation layer is represented by $Al_XO_Y$, a value of X/Y is less than ⅔.

12. An amplifier comprising the semiconductor device as claimed in claim 1.

13. A power supply device comprising the semiconductor device as claimed in claim 1.

* * * * *